United States Patent
Lim et al.

(10) Patent No.: US 12,300,326 B2
(45) Date of Patent: May 13, 2025

(54) SEMICONDUCTOR MEMORY DEVICE AND OPERATING METHOD THEREOF

(71) Applicant: SK hynix Inc., Icheon-si (KR)

(72) Inventors: Kwang Min Lim, Icheon-si (KR); Hee Youl Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 664 days.

(21) Appl. No.: 17/367,173

(22) Filed: Jul. 2, 2021

(65) Prior Publication Data

US 2022/0215886 A1    Jul. 7, 2022

(30) Foreign Application Priority Data

Jan. 5, 2021   (KR) .................... 10-2021-0001138

(51) Int. Cl.
| | |
|---|---|
| *G11C 16/14* | (2006.01) |
| *G11C 16/04* | (2006.01) |
| *G11C 16/08* | (2006.01) |
| *G11C 16/10* | (2006.01) |
| *G11C 16/28* | (2006.01) |
| *G11C 16/30* | (2006.01) |

(52) U.S. Cl.
CPC .......... *G11C 16/14* (2013.01); *G11C 16/0433* (2013.01); *G11C 16/08* (2013.01); *G11C 16/102* (2013.01); *G11C 16/28* (2013.01); *G11C 16/30* (2013.01)

(58) Field of Classification Search
CPC ..... G11C 16/14; G11C 16/0433; G11C 16/08; G11C 16/102; G11C 16/28; G11C 16/30; G11C 16/10; G11C 16/0483; G11C 16/24; G11C 16/32
See application file for complete search history.

(56) References Cited

U.S. PATENT DOCUMENTS

| | | | | |
|---|---|---|---|---|
| 10,008,271 B1 * | 6/2018 | Diep | ...................... | G11C 16/26 |
| 10,593,411 B1 * | 3/2020 | Chen | ...................... | G11C 7/04 |
| 10,636,500 B1 * | 4/2020 | Chen | ...................... | H10B 41/50 |

(Continued)

FOREIGN PATENT DOCUMENTS

| | | |
|---|---|---|
| KR | 100923580 B1 | 10/2009 |
| KR | 1020180062836 A | 6/2018 |
| KR | 1020200055595 A | 5/2020 |

*Primary Examiner* — Jay W. Radke
(74) *Attorney, Agent, or Firm* — WILLIAM PARK & ASSOCIATES LTD.

(57) ABSTRACT

A semiconductor memory device includes a memory block, a peripheral circuit, and control logic. The memory block includes dummy memory cells connected to dummy word lines and normal memory cells connected to normal word lines. The peripheral circuit performs an erase operation on the memory block. The control logic controls an operation of the peripheral circuit. The control logic controls the peripheral circuit to perform a pre-program operation on first dummy memory cells connected to first dummy word lines among the dummy word lines, in response to an erase command for the memory block, and perform a pre-program operation on second dummy memory cells connected to second dummy word lines among the dummy word lines, after the pre-program operation on the first dummy memory cells. The control logic controls the peripheral circuit to perform an erase operation on the normal memory cells.

20 Claims, 20 Drawing Sheets

(56) References Cited

U.S. PATENT DOCUMENTS

| | | | |
|---|---|---|---|
| 2006/0239077 A1* | 10/2006 | Park | G11C 16/3445 365/185.17 |
| 2008/0130363 A1* | 6/2008 | Hosono | G11C 16/3418 365/185.33 |
| 2009/0059669 A1* | 3/2009 | Toriyama | H10B 69/00 365/185.17 |
| 2009/0262576 A1* | 10/2009 | Moon | G11C 16/0483 365/185.29 |
| 2012/0155184 A1* | 6/2012 | Kang | G11C 11/5621 365/185.33 |
| 2013/0308380 A1* | 11/2013 | Kim | G11C 16/06 365/185.2 |
| 2016/0064084 A1* | 3/2016 | Lu | G11C 11/5671 365/185.22 |
| 2016/0141043 A1* | 5/2016 | Lee | G11C 16/08 365/185.11 |
| 2016/0323096 A1* | 11/2016 | Kara-Ivanov | H04L 9/0861 |
| 2016/0336071 A1* | 11/2016 | Park | G11C 16/3459 |
| 2017/0069391 A1* | 3/2017 | Lee | G11C 16/10 |
| 2018/0137919 A1* | 5/2018 | Lee | G11C 11/5635 |
| 2020/0202936 A1* | 6/2020 | Lee | G11C 16/0483 |
| 2020/0350017 A1* | 11/2020 | Lee | G11C 16/10 |
| 2021/0043645 A1* | 2/2021 | Lee | G11C 16/0483 |
| 2021/0174885 A1* | 6/2021 | Jia | G11C 16/08 |
| 2021/0202013 A1* | 7/2021 | Zhang | G11C 16/28 |
| 2021/0375365 A1* | 12/2021 | Lee | G11C 16/3459 |
| 2023/0046677 A1* | 2/2023 | Yang | G11C 16/34 |

* cited by examiner

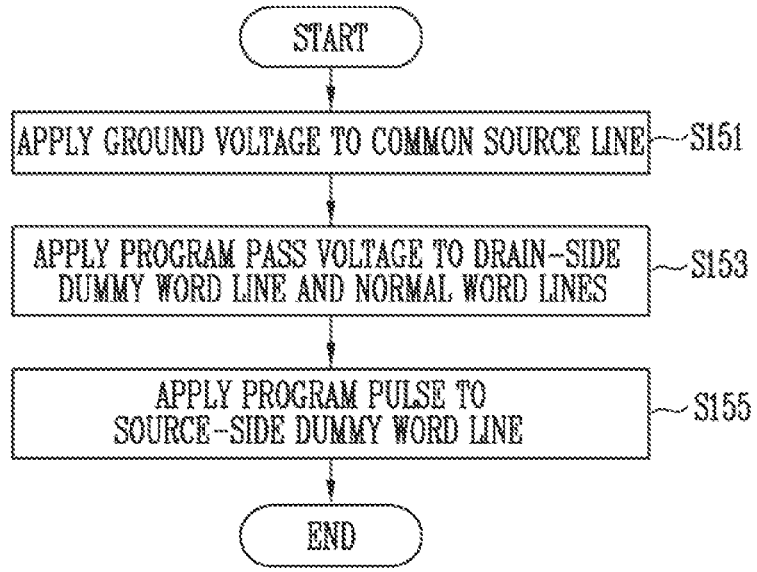
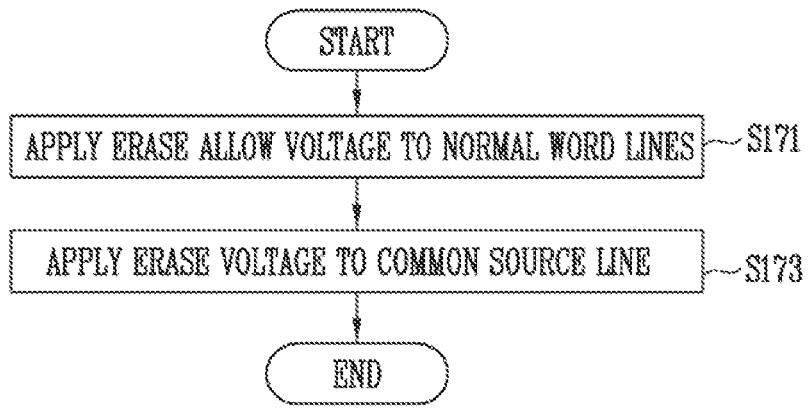

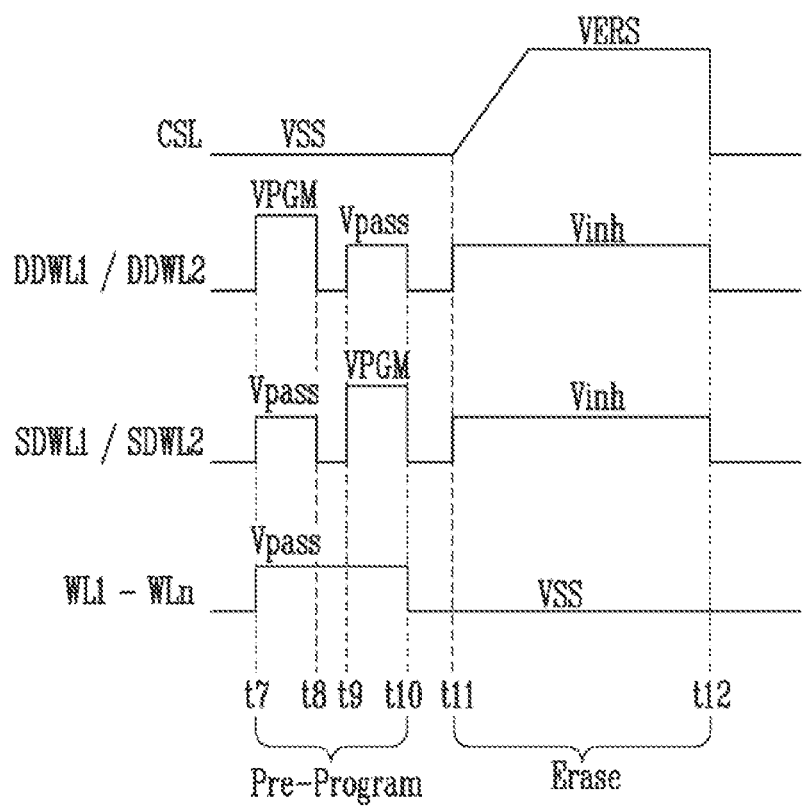

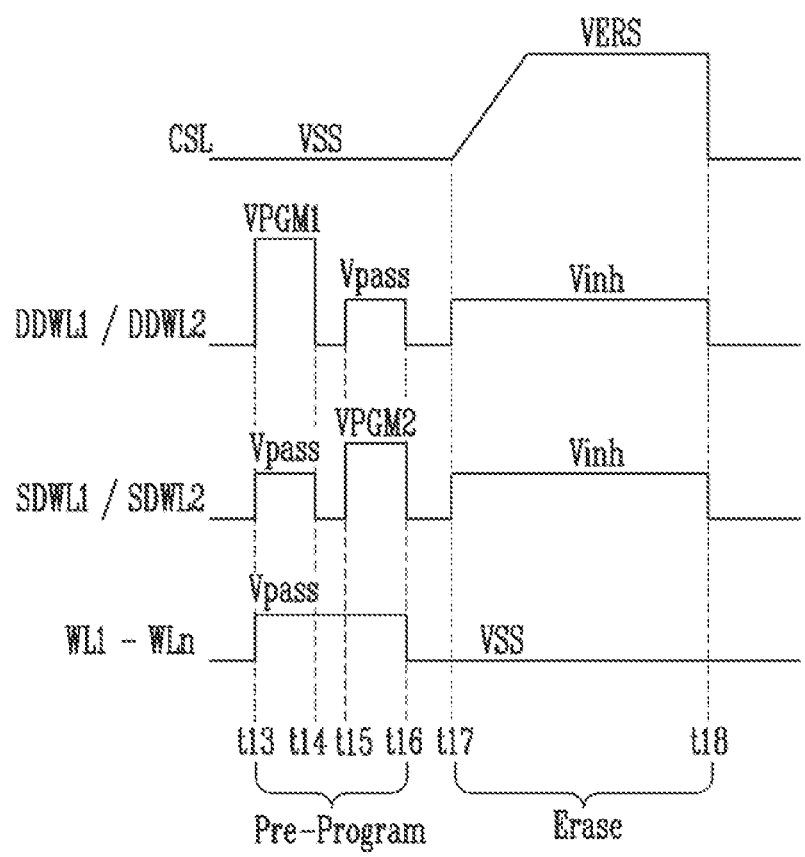

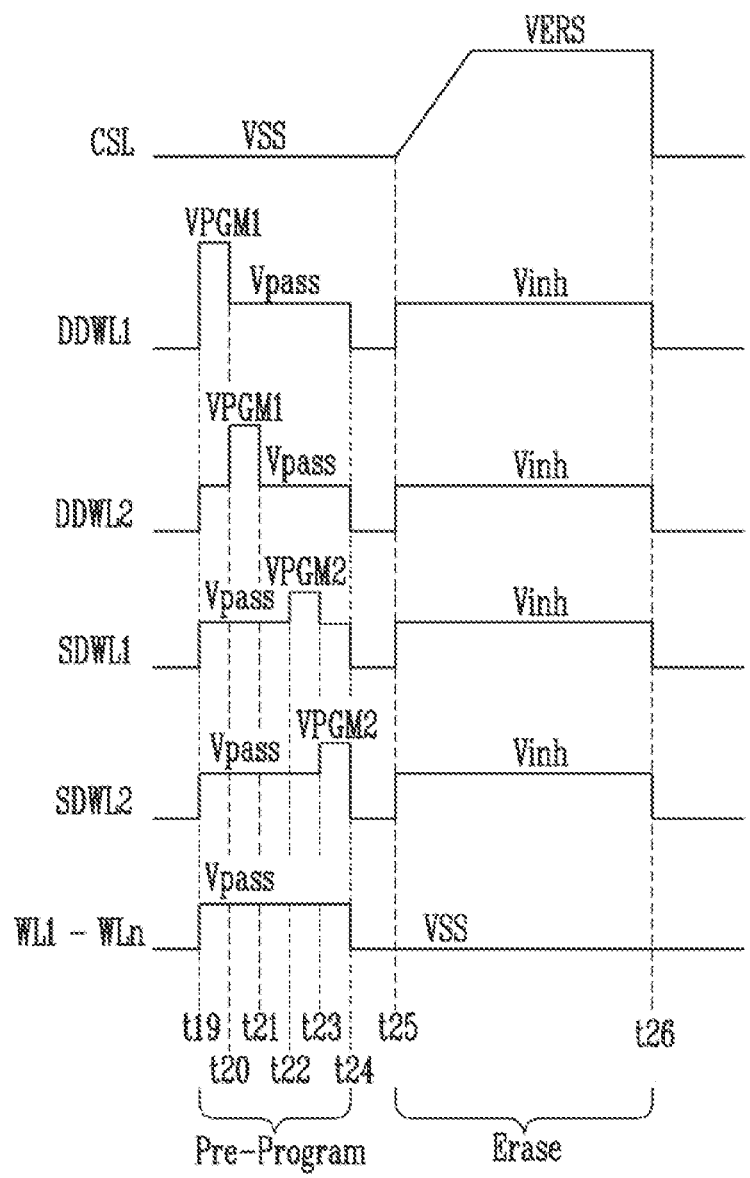

SEMICONDUCTOR MEMORY DEVICE AND OPERATING METHOD THEREOF

CROSS-REFERENCE TO RELATED APPLICATION

The present application claims priority under 35 U.S.C. § 119(a) to Korean patent application number 10-2021-0001138 filed on Jan. 5, 2021, in the Korean Intellectual Property Office, the entire disclosure of which is incorporated by reference herein.

BACKGROUND

1. Technical Field

The present disclosure generally relates to an electronic device, and more particularly, to a semiconductor memory device and an operating method thereof.

2. Related Art

A semiconductor memory device may be formed in a two-dimensional structure in which strings are arranged parallel to a horizontal semiconductor substrate, or be formed in a three-dimensional structure in which strings are arranged perpendicular to a horizontal semiconductor substrate. A three-dimensional memory device is a semiconductor memory device devised so as to overcome the limit in the degree of integration of two-dimensional semiconductor memory devices, and may include a plurality of memory cells vertically stacked above a semiconductor substrate.

SUMMARY

Some embodiments are directed to a semiconductor memory device having improved reliability and an operating method of the semiconductor device.

In accordance with an embodiment of the present disclosure, a semiconductor memory device includes: a memory block including dummy memory cells connected to dummy word lines and normal memory cells connected to normal word lines; a peripheral circuit configured to perform an erase operation on the memory block; and control logic configured to control an operation of the peripheral circuit. The control logic is configured to control the peripheral circuit to perform: a pre-program operation on first dummy memory cells connected to first dummy word lines among the dummy word lines, in response to an erase command for the memory block; a pre-program operation on second dummy memory cells connected to second dummy word lines among the dummy word lines, after the pre-program operation on the first dummy memory cells; and an erase operation on the normal memory cells.

The memory block may include drain select transistors connected to bit lines and source select transistors connected to a common source line. The first dummy memory cells may be located between the normal memory cells and the drain select transistors, and the second dummy memory cells may be located between the normal memory cells and the source select transistors.

During the pre-program operation on the first dummy memory cells, the control logic may control the peripheral circuit to apply a ground voltage to the common source line, to apply a program pass voltage to the second dummy word lines and the normal word lines, and to apply a first program pulse to the first dummy word lines.

During the pre-program operation on the second dummy memory cells, the control logic controls the peripheral circuit to apply a ground voltage to the common source line, to apply a program pass voltage to the first dummy word lines and the normal word lines, and to apply a second program pulse to the second dummy word lines.

The first program pulse may have the same voltage magnitude as the second program pulse.

The first program pulse may have a higher voltage than the second program pulse.

The first program pulse may have a lower voltage than the second program pulse.

During the erase operation on the normal memory cells, the control logic may control the peripheral circuit to apply an erase inhibit voltage to the first and second dummy word lines, to apply an erase allow voltage to the normal word lines, and to apply an erase voltage to the common source line.

During the erase operation on the normal memory cells, the control logic may control the peripheral circuit to float the first and second dummy word lines, to apply an erase allow voltage to the normal word lines, and to apply an erase voltage to the common source line.

The control logic may control the peripheral circuit to perform a pre-program operation on third dummy memory cells connected to third dummy word lines among the dummy word lines, after the pre-program operation on the second dummy memory cells is performed.

The memory block may include drain select transistors connected to bit lines and source select transistors connected to a common source line. The first dummy memory cells may be located between the normal memory cells and the drain select transistors, the second dummy memory cells may be located between the normal memory cells, and the third memory cells may be located between the normal memory cells and the source select transistors.

In accordance with another embodiment of the present disclosure is a method for operating a semiconductor memory device including a plurality of memory blocks each including first dummy memory cells connected to a first dummy word line, second dummy memory cells connected to a second dummy word line, and normal memory cells connected to normal word lines. The method includes: receiving an erase command; pre-programming first dummy memory cells included in a selected memory block corresponding to the erase command among the plurality of memory blocks; pre-programming second dummy memory cells included in the selected memory block; and erasing normal memory cells included in the selected memory block.

Pre-programming the first dummy memory cells may include: applying a ground voltage to a common source line connected to the selected memory block; applying a program pass voltage to the second dummy word line and the normal word lines; and applying a first program pulse to the first dummy word line.

Pre-programming the second dummy memory cells may include: applying a ground voltage to a common source line connected to the selected memory block; applying a program pass voltage to the first dummy word line and the normal word lines; and applying a second program pulse to the second dummy word line.

The first dummy memory cells may be drain-side dummy memory cells, and the second dummy memory cells may be source-side dummy memory cells.

The first dummy memory cells may be source-side dummy memory cells, and the second dummy memory cells may be drain-side dummy memory cells.

The erasing of the normal memory cells may include: applying an erase allow voltage to the normal word lines and applying an erase inhibit voltage to the dummy word lines; and applying an erase voltage to the common source line.

Erasing the normal memory cells may include: applying an erase allow voltage to the normal word lines and floating the dummy word lines; and applying an erase voltage to the common source line.

The semiconductor memory device may further include third dummy memory cells connected to a third dummy word line. The method may further include pre-programming third dummy memory cells included in the selected memory block, after pre-programming the second dummy memory cells and before erasing the normal memory cells.

The first dummy memory cells may be drain-side dummy memory cells, the second dummy memory cells may be dummy memory cells located between the normal memory cells, and the third dummy memory cells may be source-side dummy memory cells.

BRIEF DESCRIPTION OF THE DRAWINGS

Example embodiments are described more fully hereinafter with reference to the accompanying drawings; however, they may be embodied in different forms and should not be construed as being limited to the embodiments set forth herein. Rather, these embodiments are provided so that this disclosure will be enabling to those skilled in the art.

In the drawings, dimensions may be exaggerated for clarity of illustration. It will be understood that when an element is referred to as being "between" two elements, it may be the only element between the two elements, or one or more intervening elements may also be present. Like reference numerals refer to like elements throughout the drawings.

FIG. 7B is a flowchart illustrating an embodiment of step S150 shown in FIG. 5.

FIG. 8 is a flowchart illustrating an embodiment of step S170 shown in FIG. 5.

FIG. 9 is a timing diagram illustrating an operating method of the semiconductor memory device in accordance with another embodiment of the present disclosure.

FIG. 10 is a timing diagram illustrating an operating method of the semiconductor memory device in accordance with still another embodiment of the present disclosure.

FIG. 12 is a timing diagram illustrating an operating method of the semiconductor memory device in accordance with still another embodiment of the present disclosure.

DETAILED DESCRIPTION

The specific structural and functional descriptions disclosed herein are merely illustrative for the purpose of describing embodiments according to the concept of the present disclosure. Embodiments presented in this disclosure can be implemented in various forms, and should not be construed as being limited as set forth herein.

Figure 1:
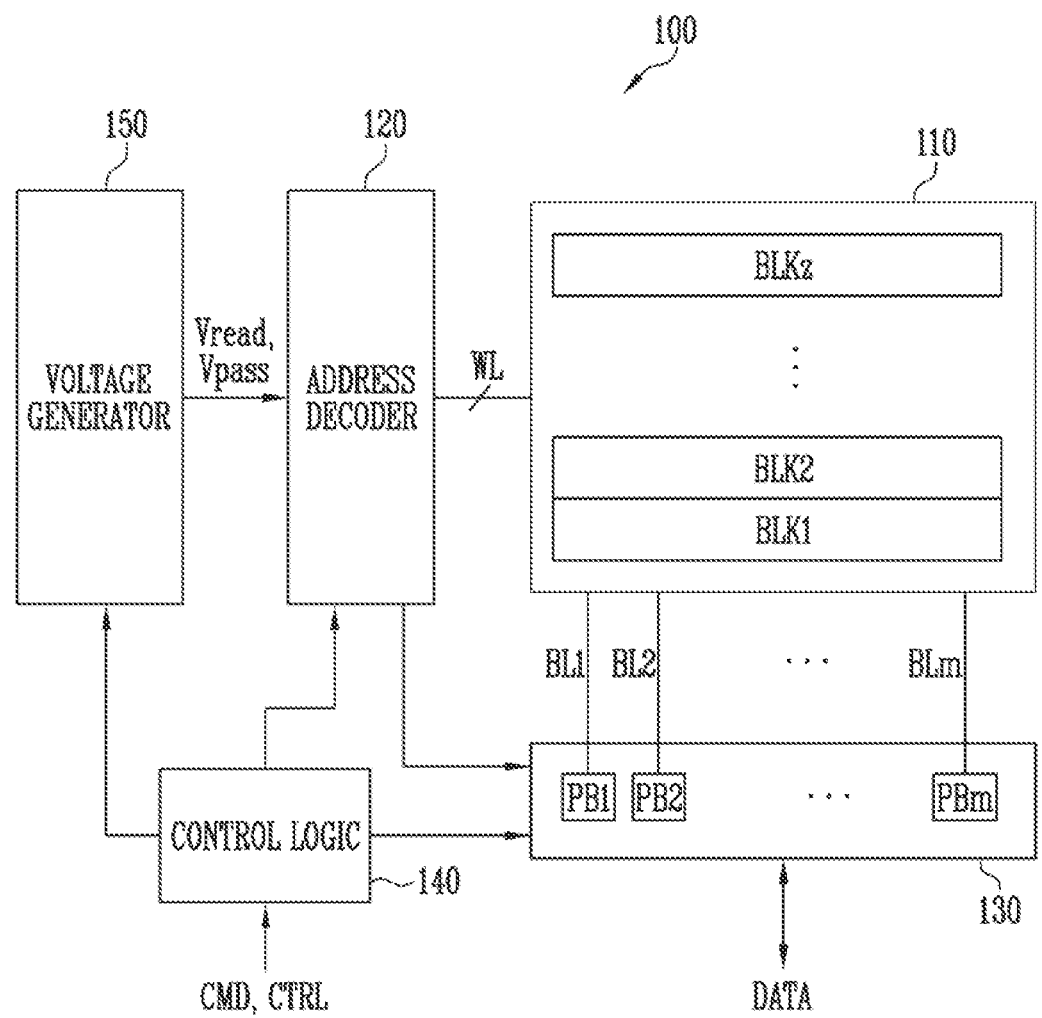
FIG. 1 is a block diagram illustrating a semiconductor memory device in accordance with an embodiment of the present disclosure.

FIG. 1 is a block diagram illustrating a semiconductor memory device in accordance with an embodiment of the present disclosure.

Referring to FIG. 1, the semiconductor memory device 100 may include a memory cell array 110, an address decoder 120, a read/write circuit 130, control logic 140, and a voltage generator 150.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read/write circuit 130 through bit lines BL1 to BLm. Each of the plurality of memory blocks BLK1 to BLKz includes a plurality of memory cells. In an embodiment, the plurality of memory cells may be nonvolatile memory cells, and be configured as nonvolatile memory cells having a vertical channel structure. The memory cell array 110 may be configured as a memory cell array having a two-dimensional structure. In some embodiments, the memory cell array 110 may be configured as a memory cell array having a three-dimensional structure. Meanwhile, each of the plurality of memory cells included in the memory cell array 110 may store at least 1-bit data. In an embodiment, each of plurality of the memory cells included in the memory cell array 110 may be a single-level cell (SLC) storing 1-bit data. In another embodiment, each of the plurality of memory cells included in the memory cell array 110 may be a multi-level cell (MLC) storing 2-bit data. In still another embodiment, each of the plurality of memory cells included in the memory cell array 110 may be a triple-level cell (TLC) storing 3-bit data. In still another embodiment, each of the plurality of memory cells included in the memory cell array 110 may be a quadruple-level cell (QLC) storing 4-bit data. In some embodiments, the memory cell array 110 may include a plurality of memory cells each storing 5-or-more bit data.

The address decoder 120, the read/write circuit 130, and the voltage generator 150 operate as a peripheral circuit for driving the memory cell array 110, The peripheral circuit operates under the control of the control logic 140. The address decoder 120 is connected to the memory cell array 110 through the word lines WL. The address decoder 120 operates under the control of the control logic 140. The address decoder 120 receives an address through an input/output buffer (not shown) in the semiconductor memory device 100.

The address decoder 120 decodes a block address in the received address. The address decoder 120 selects at least one memory block according to the decoded block address. Also, in a read voltage application operation during a read operation, the address decoder 120 applies a read voltage Vread generated by the voltage generator 150 to a selected word line of the selected memory block, and applies a pass voltage Vpass generated by the voltage generator 150 to the other unselected word lines. Also, in a program verify operation, the address decoder 120 applies a verify voltage generated by the voltage generator 150 to the selected word line of the selected memory block, and applies the pass voltage Vpass to the other unselected word lines.

The address decoder 120 decodes a column address in the received addresses. The address decoder 120 transmits the decoded column address to the read/write circuit 130.

Read and program operations of the semiconductor memory device 100 are performed in units of pages. An address received in response to a request for the read and program operations includes a block address, a row address, and a column address. The address decoder 120 selects one memory block and one word line according to the block address and the row address. The column address is decoded by the address decoder 120 to be provided to the read/write circuit 130.

The address decoder 120 may include a block decoder, a row decoder, a column decoder, an address buffer, and the like.

The read/write circuit 130 includes a plurality of page buffers PB1 to PBm. The read/write circuit 130 may operate as a "read circuit" in a read operation, and operate as a "write circuit" in a write operation. The plurality of page buffers PB1 to PBm are connected to the memory cell array 110 through the bit lines BL1 to BLm. In order to sense a threshold voltage of memory cells in a read operation or a program verify operation, the plurality of page buffers PB1 to PBm latch sensing data by sensing, through a sensing node, a change in amount of current flowing according to a program state of a corresponding memory cell while continuously supplying a sensing current to bit lines connected to the memory cells. The read/write circuit 130 operates in response to page buffer control signals output from the control logic 140.

In a read operation, the read/write circuit 130 temporarily stores read data by sensing data of a memory cell and then outputs data DATA to the input/output buffer (not shown) of the semiconductor memory device 100. In an embodiment, the read/write circuit 130 may include a column select circuit and the like in addition to the page buffers (or page registers).

The control logic 140 is connected to the address decoder 120, the read/write circuit 130, and the voltage generator 150. The control logic 140 receives a command CMD and a control signal CTRL though the input/output buffer (not shown) of the semiconductor memory device 100. The control logic 140 controls a general operation of the semiconductor memory device 100 in response to the control signal CTRL. Also, the control logic 140 outputs a control signal for adjusting a sensing node precharge potential level of the plurality of page buffers PB1 to PBm. The control logic 140 may control the read/write circuit 130 to perform a read operation of the memory cell array 110. The control logic 140 controls the voltage generator 150 to generate various voltages used in a program operation of the memory cell array 110. Also, the control logic 140 controls the address decoder 120 to transfer the voltages generated from the voltage generator 150 to local lines of a memory block as an operation target through global lines. Meanwhile, the control logic 140 controls the read/write circuit 130 to read data of a selected page of the memory block through the bit lines BL1 to BLm in a read operation and then store the read data in the page buffers PB1 to PBm. Also, the control logic 140 controls the read/write circuit 130 to program the data stored in the page buffers PB1 to PBm to the selected page in the program operation. The control logic 140 may be implemented as hardware, software, or a combination of hardware and software. For example, the control logic 140 may be a control logic circuit operating in accordance with an algorithm and/or a processor executing control logic code.

The voltage generator 150 generates a read voltage Vread and a pass voltage Vpass in a read operation in response to a control signal output from the control logic 140. In order to generate a plurality of voltages having various voltage levels, the voltage generator 150 may include a plurality of pumping capacitors for receiving an internal power voltage, and generate the plurality of voltages by selectively activating the plurality of pumping capacitors under the control of the control logic 140.

The address decoder 120, the read/write circuit 130, and the voltage generator 150 may serve as a peripheral circuit for performing a read operation, a write operation, and an erase operation on the memory cell array 110. The peripheral circuit performs the read operation, the write operation, and the erase operation on the memory cell array 110 under the control of the control logic 140.

Figure 2:
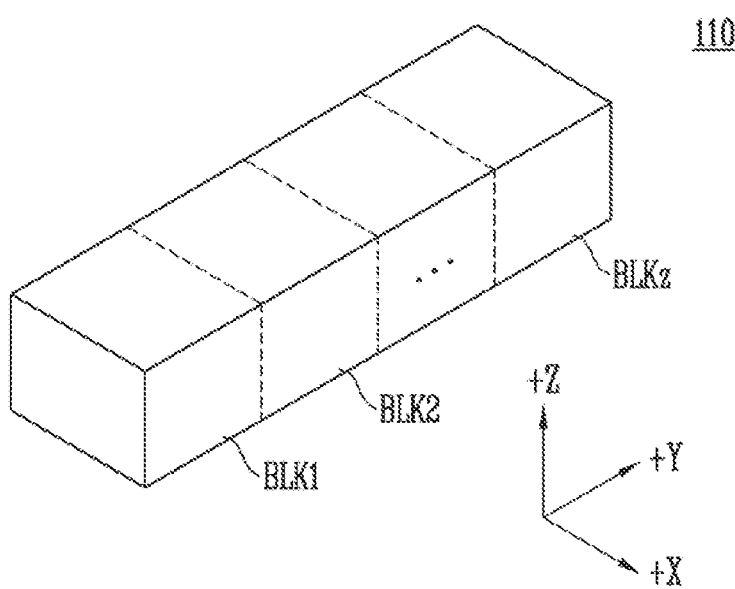
FIG. 2 is a diagram illustrating an embodiment of a memory cell array shown in FIG. 1.

FIG. 2 is a diagram illustrating an embodiment of the memory cell array 110 shown in FIG. 1.

Referring to FIG. 2, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 3 and 4.

Figure 3:
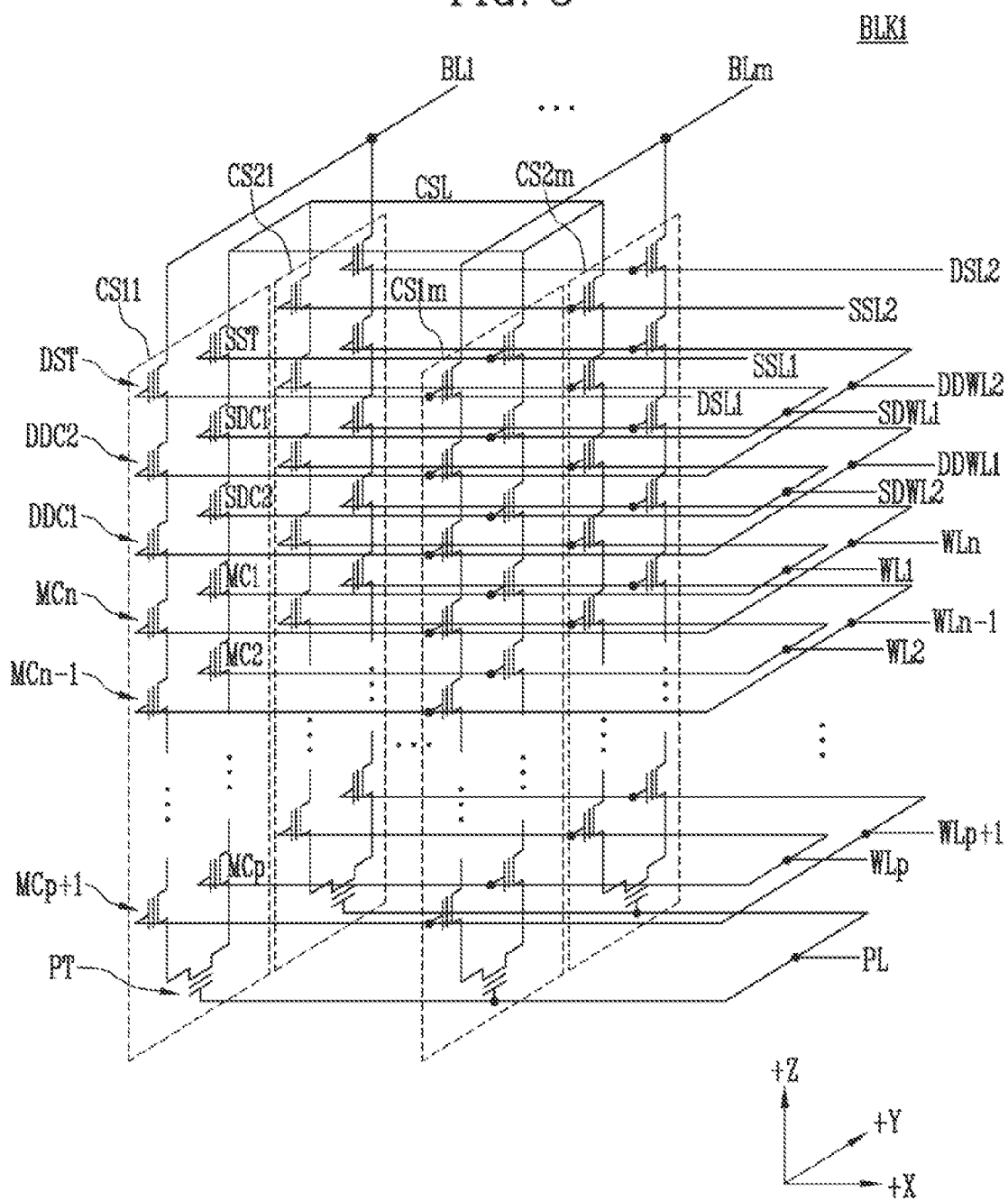
FIG. 3 is a circuit diagram illustrating any one memory block among memory blocks shown in FIG. 2.

FIG. 3 is a circuit diagram illustrating any one memory block, taken to be memory clock BLK1, among the memory blocks BLK1 to BLKz shown in FIG. 2.

Referring to FIG. 3, the first memory block BLK1 may include a plurality of cell strings CS11 to CS1*m* and CS21 to CS2*m*. In an embodiment, each of the plurality of cell strings CS11 to CS1*m* and CS21 to CS2*m* may be formed in a 'U' shape. In the first memory block BLK1, m cell strings are arranged in a row direction (i.e., a +X direction). Although a case two cell strings arranged in a column direction (i.e., a +Y direction) is illustrated in FIG. 3, this is for convenience of description, and it will be understood that three cell strings may be arranged in the column direction.

Each of the plurality of cell strings CS11 to CS1*m* and CS21 to CS2*m* may include at least one source select transistor SST, at least one source-side dummy memory cell SDC1 and SDC2, first to nth normal memory cells MC1 to MCn, a pipe transistor PT, at least one drain-side dummy memory cell DDC1 and DDC2, and at least one drain select transistor DST.

The select transistors SST and DST, the dummy memory cells SDC1, SDC2, DDC1, and DDC2, and the normal memory cells MC1 to MCn may have structures similar to one another. In an embodiment, each of the select transistors SST and DST, the dummy memory cells SDC1, SDC2, DDC1, and DDC2, and the normal memory cells MC1 to MCn may include a channel layer, a tunneling insulating layer, a charge storage layer, and a blocking insulating layer.

The source select transistor SST of each cell string is connected between a common source line CSL and source-side dummy memory cells SDC1 and SDC2.

In an embodiment, the source select transistors of cell strings arranged on the same row are connected to a source select line extending in the row direction, and the source select transistors of cell strings arranged on different rows are connected to different source select lines. In FIG. 3, the source select transistors of the cell strings CS11 to CS1*m* on a first row are connected to a first source select line SSL1. The source select transistors of the cell strings CS21 to CS2*m* on a second row are connected to a second source select line SSL2.

Two source-side dummy memory cells SDC1 and SDC2 may be provided in each cell string. However, this is merely illustrative, and it will be understood that three or more source-side dummy memory cells may be provided in each cell string. The source-side dummy memory cells SDC1 and SDC2 of each cell string are connected in series between the source select transistor SST and normal memory cells MC1 to MCp. A gate of a first source-side dummy memory cell SDC1 of each cell string is connected to a first source-side dummy word line SDWL1. A gate of a second source-side dummy memory cell SDC2 of each cell string is connected to a second source-side dummy word line SDWL2.

The first to nth normal memory cells MC1 to MCn of each cell string are connected between the source-side dummy memory cells SDC1 and SDC2 and drain-side dummy memory cells DDC1 and DDC2.

The first to nth normal memory cells MC1 to MCn may be divided into first to pth normal memory cells MC1 to MCp and (p+1)th to nth normal memory cells MCp+1 to MCn. The first to pth normal memory cells MC1 to MCp are sequentially arranged in the opposite direction of a +Z direction, and are connected in series between the source-side dummy memory cells SDC1 and SDC2 and the pipe transistor PT. The (p+1)th to nth normal memory cells MCp+1 to MCn are sequentially arranged in the +Z direction, and are connected in series between the pipe transistor PT and the drain-side dummy memory cells DDC1 and DDC2. The first to pth normal memory cells MC1 to MCp and the (p+1)th to nth normal memory cells MCp+1 to MCn are connected through the pipe transistor PT. Gate electrodes of the first to nth normal memory cells MC1 to MCn of each cell string are connected to first to nth normal word lines WL1 to WLn, respectively.

Data may be stored in the first to nth normal memory cells MC1 to MCn through first to mth bit lines BL1 to BLm. The data stored in the first to nth normal memory cells MC1 to MCn may be read through the first to mth bit lines BL1 to BLm.

A gate of the pipe transistor PT of each cell string is connected to a pipe line PL.

Two drain-side dummy memory cells DDC1 and DDC2 are provided in each cell string. However, this is merely illustrative, and it will be understood that three or more drain-side dummy memory cells may be provided in each cell string. The drain-side dummy memory cells DDC1 and DDC2 of each cell string is connected in series between the drain select transistor DST and the normal memory cells MCp+1 to MCn. A gate of a first drain-side dummy memory cell DDC1 of each cell string is connected to a first drain-side dummy word line DDWL1. A gate of a second drain-side dummy memory cell DDC2 of each cell string is connected to a second drain-side dummy word line DDWL2.

The drain select transistor DST of each cell string is connected between a corresponding bit line and the drain-side dummy memory cells DDC1 and DDC2. Cell strings arranged in the row direction are connected to a drain select line extending in the row direction. The drain select transistors of the cell strings CS11 to CS1*m* on the first row are connected to a first drain select line DSL1. The drain select transistors of the cell strings CS21 to CS2*m* on the second row are connected to a second drain select line DSL2.

Cell strings arranged in the column direction are connected to a bit line extending in the column direction. In FIG. 3, the cell strings CS11 and CS21 on a first column are connected to a first bit line BL1. The cell strings CS1*m* and CS2*m* on an mth column are connected to an mth bit line BLm.

In another embodiment, even bit lines and odd bit lines may be provided instead of the first to mth bit lines BL1 to BLm. In addition, even-numbered cell strings among the cell strings CS11 to CS1*m* or CS21 to CS2*m* arranged in the row direction may be connected to the even bit lines, respectively, and odd-numbered cell strings among the cell strings CS11 to CS1*m* or CS21 to CS2*m* arranged in the row direction may be connected to the odd bit lines, respectively.

The dummy memory cells SDC1, SDC2, DDC1, and DDC2 are provided to stably control a voltage or current of a corresponding cell string. For example, the source-side dummy memory cells SDC1 and SDC2 may be provided to decrease an electric field between the source select transistor SST and the normal memory cells MC1 to MCp. For example, the drain-side dummy memory cells DDC1 and DDC2 may be provided to decrease an electric field between the drain select transistor DST and the normal memory cells MCp+1 to MCn. When the number of dummy memory cells increases, the reliability of an operation of the memory block BLK1 is improved. On the other hand, the size of the memory block BLK1 increases. When the number of dummy memory cells decreases, the size of the memory block BLK1 decreases. On the other hand, the reliability of an operation of the memory block BLK1 may be deteriorated.

In order to efficiently control the dummy memory cells SDC1, SDC2, DDC1, and DDC2, it is required to have a threshold voltage which the dummy memory cells SDC1, SDC2, DDC1, and DDC2 desire. Before an erase operation on the memory block BLK1, pre-program operation on all or some of the dummy memory cells SDC1, SDC2, DDC1, and DDC2 may be performed.

Figure 4:
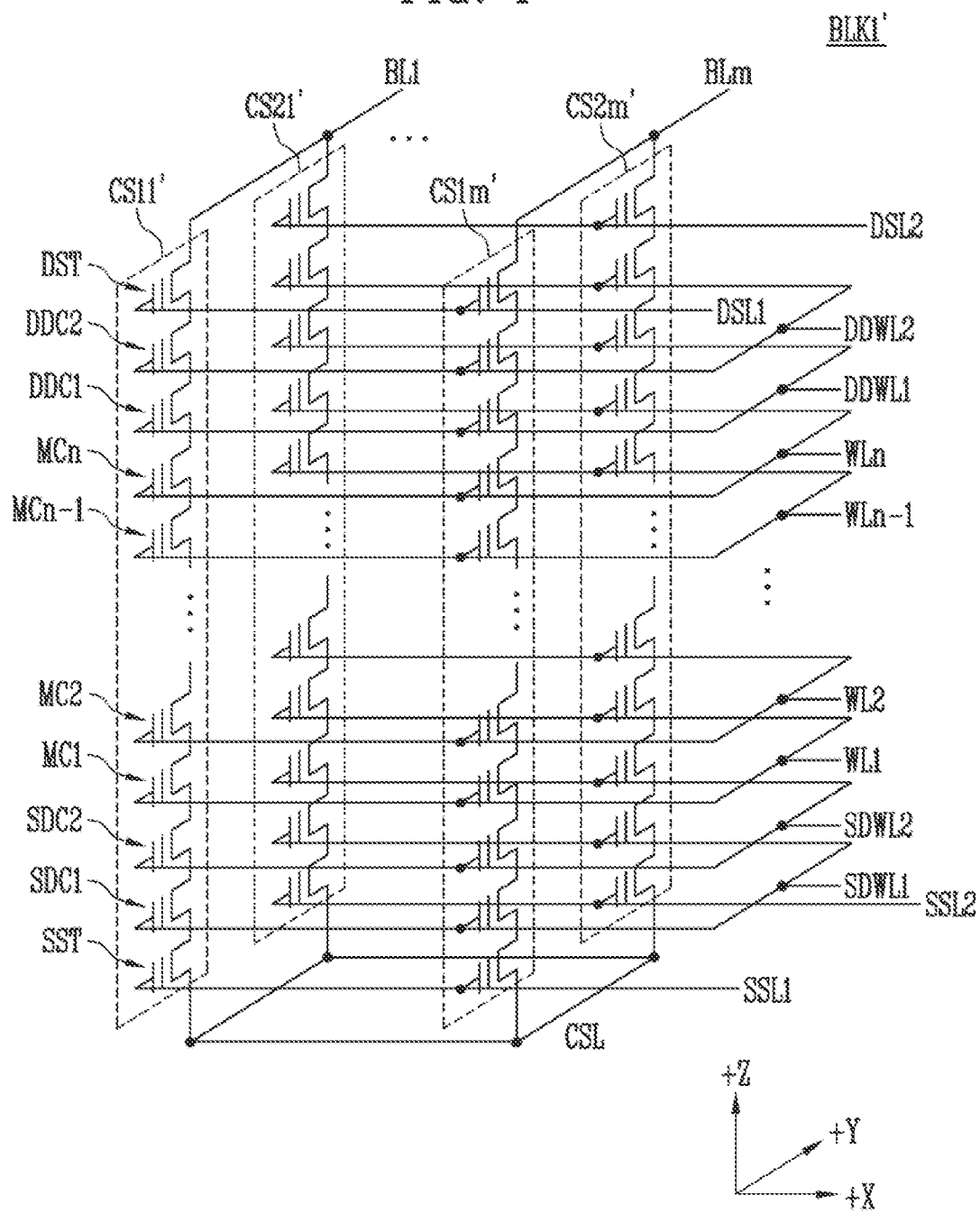
FIG. 4 is a circuit diagram illustrating another embodiment of the one memory block among the memory blocks shown in FIG. 2.

FIG. 4 is a circuit diagram illustrating another embodiment BLK1' of the one memory block among the memory blocks BLK1 to BLKz shown in FIG. 2.

Referring to FIG. 4, the first memory block BLK1' may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, at least one source-side dummy memory cell SDC1 and SDC2, first to nth normal memory cells MC1 to MCn, at least one drain-side dummy memory cell DDC1 and DDC2, and at least one drain select transistor DST, which are stacked on a substrate (not shown) under the first memory block BLK1'.

The source select transistor SST of each cell string is connected between a common source line CSL and source-side dummy memory cells SDC1 and SDC2. Source select transistors of cell strings (e.g., CS11' to CS1m') arranged on the same row are connected to the same source select line (e.g., SSL1). Source select transistors of the cell strings CS11' to CS1m' arranged on a first row are connected to a first source select line SSL1. Source select transistors of the cell strings CS21' to CS2m' arranged on a second row are connected to a second source select line SSL2.

The source-side dummy memory cells SDC1 and SDC2 of each cell string are connected in series between the source select transistor SST and the normal memory cells MC1 to MCn. Source-side dummy memory cells at the same height are connected to the same source-side dummy word line. Gates of first and second source-side dummy memory cells SDC1 and SDC2 are respectively connected to first and second source-side dummy word lines SDWL1 and SDWL2.

The first to nth normal memory cells MC1 to MCn of each cell string are connected in series between the source-side dummy memory cells SDC1 and SDC2 and drain-side dummy memory cells DDC1 and DDC2. Gates of the first to nth normal memory cells MC1 to MCn are connected to first to nth normal word lines WL1 to WLn.

The drain-side dummy memory cells DDC1 and DDC2 of each cell string are connected in series between the drain select transistor DST and the normal memory cells MC1 to MCn. Drain-side dummy memory cells at the same height are connected to the same source-side dummy word line. First and second drain-side dummy memory cells DDC1 and DDC2 are respectively connected to first and second drain-side dummy word lines DDWL1 and DDWL2.

The drain select transistor DST of each cell string is connected between a corresponding bit line and the drain-side dummy memory cells DDC1 and DDC2. Drain select transistors of cell strings arranged in the row direction are connected to a drain select line extending in the row direction. The drain select transistors of the cell strings CS11' to CS1m' on the first row are connected to a first drain select line DSL1. The drain select transistors of the cell strings CS21' to CS2m' on the second row are connected to a second drain select line DSL2.

Consequently, the memory block BLK1' of FIG. 4 has a circuit similar to that of the memory block BLK1 of FIG. 3, except that the pipe transistor PT is excluded from each cell string in FIG. 4.

Hereinafter, for convenience of description, embodiments of the present disclosure will be described based on the memory block BLK1 shown in FIG. 3.

Figure 5:
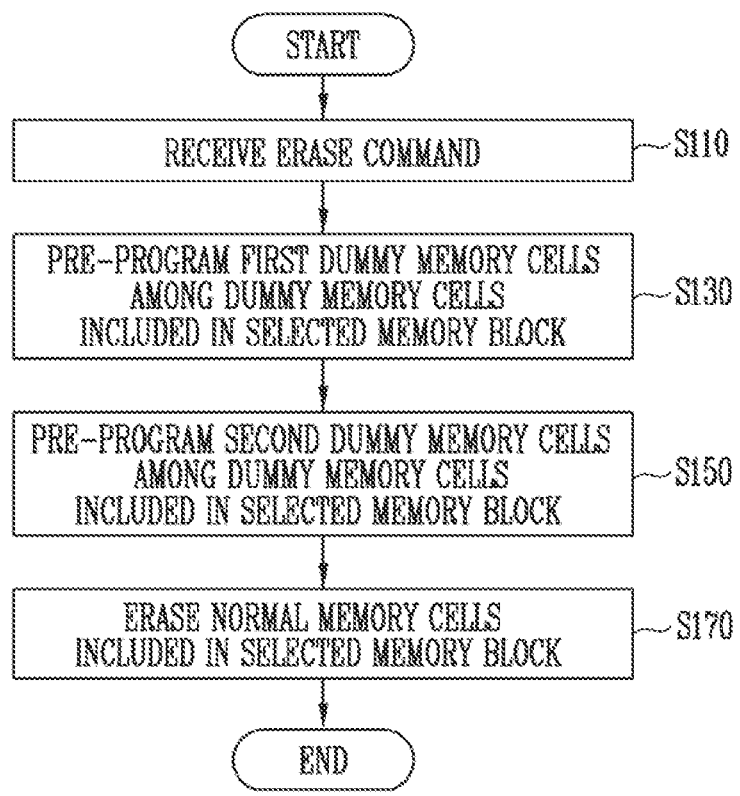
FIG. 5 is a flowchart illustrating an operating method of the semiconductor memory device in accordance with an embodiment of the present disclosure.

FIG. 5 is a flowchart illustrating an operating method of the semiconductor memory device in accordance with an embodiment of the present disclosure.

Referring to FIG. 5, the operating method of the semiconductor memory device includes step S110 of receiving an erase command, step S130 of pre-programming first dummy memory cells among dummy memory cells included in a selected memory block, step S150 of pre-programming second dummy memory cells among the dummy memory cells included in the selected memory block, and step S170 of erasing normal memory cells included in the selected memory block.

In the step S110, the semiconductor memory device 100 may receive an erase command from the outside the semiconductor memory device 100. More specifically, the semiconductor memory device 100 may receive the erase command from a controller. The semiconductor memory device 100 may receive an address of a memory block selected as an erase target together with the erase command.

In the step S130, first dummy memory cells among dummy memory cells included in the memory block selected as the erase target may be pre-programmed. That is, in the step S130, a pre-program operation on some dummy memory cells among a plurality of dummy memory cells included in the memory block selected as the erase target may be performed. To this end, the semiconductor memory device 100 may apply a program pulse to dummy word lines connected to the first dummy memory cells among word lines connected to the selected memory block. In an embodiment, a verify operation on the first dummy memory cells may be performed. In another embodiment, the verify operation on the first dummy memory cells might not be performed. In the step S130, the program pulse applied to the dummy word lines connected to the first dummy memory cells may have a voltage level for setting a threshold voltage of the first dummy memory cells as a target threshold voltage.

In the step S150, second dummy memory cells among the dummy memory cells included in the memory block selected as the erase target may be pre-programmed. The second dummy memory cells may be dummy memory cells different from the first dummy memory cells. To this end, the semiconductor memory device 100 may apply a program pulse to dummy word lines connected to the second dummy memory cells among the word lines connected to the selected memory block. In an embodiment, a verify operation on the second dummy memory cells may be performed. In another embodiment, the verify operation on the second dummy memory cells might not be performed. In the step S150, the program pulse applied to the dummy word lines connected to the second dummy memory cells may have a voltage level for setting a threshold voltage of the second dummy memory cells as a target threshold voltage.

In the step S170, normal memory cells included in the selected memory block may be erased. To this end, the semiconductor memory device 100 may apply an erase voltage VERS to the common source line CSL. The semiconductor memory device 100 may control the source select transistor SST and the drain select transistor DST to be in a floating state. Also, the semiconductor memory device 100 may apply an erase allow voltage (e.g., a ground voltage) to normal word lines connected to the selected memory block. Also, the semiconductor memory device 100 may apply an erase inhibit voltage to dummy word lines connected to the selected memory block. Subsequently, a potential level of a channel may be increased according to a potential level of the common source line CSL, and according to the potenttial level of the channel, a potential level of source select lines and drain select lines, which are connected to a plurality of source select transistors and a plurality of drain select transistors in the floating state, may be increased due to a coupling phenomenon.

Data stored in the normal memory cells are erased by the increased potential level of the channel. That is, due to an FN tunneling phenomenon, electrons stored in a charge storage layer of the normal memory cells are detrapped by the potential level of the channel. This will be described in more detail. Electrons stored in a charge storage layer of memory cells are escaped and then detrapped according to a difference between the increased potential level of the channel and a potential level of local word lines having a ground level, or hot holes generated in the channel are introduced to the charge storage layer of the memory cells, so that electrons stored in the charge storage layer are detrapped.

After the data of the normal memory cells is erased by the erase operation, the erase voltage VERS applied to the common source line CSL is blocked, and a potential of the common source line CSL is discharged. When the erase voltage VERS having a high voltage level is applied to the common source line CSL in the erase operation, the source select transistor is in the floating state. Hence, a Gate Introduced Drain Leakage (GIDL) current is generated due to a voltage difference with a source side, and hot holes are generated and then introduced in a channel direction. Therefore, a potential of the channel may be increased.

Figure 6:
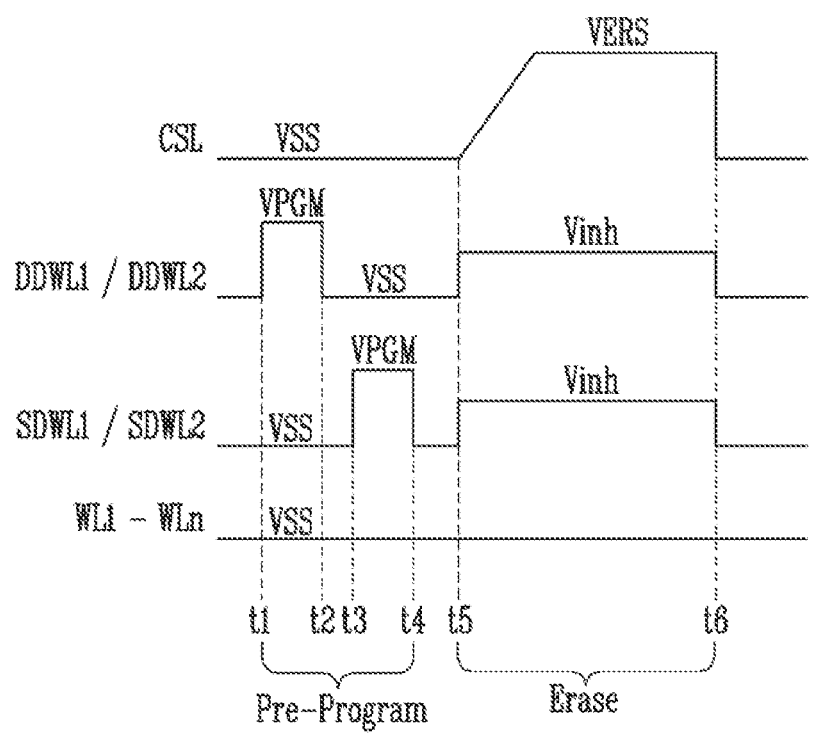
FIG. 6 is a timing diagram illustrating an operating method of the semiconductor memory device in accordance with an embodiment of the present disclosure.
Figure 7A:
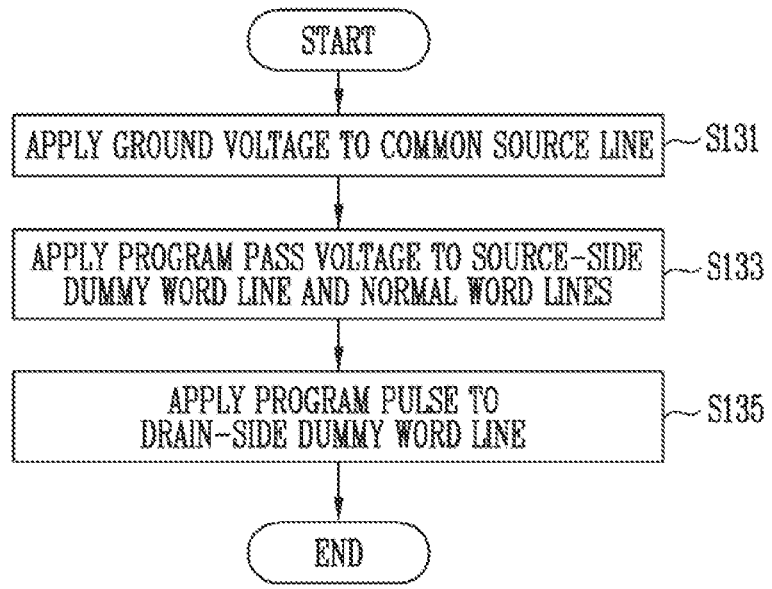
FIG. 7A is a flowchart illustrating an embodiment of step S130 shown in FIG. 5.

FIG. 6 is a timing diagram illustrating an operating method of the semiconductor memory device in accordance with an embodiment of the present disclosure. FIG. 7A is a flowchart illustrating an embodiment of the step S130 shown in FIG. 5. FIG. 7B is a flowchart illustrating an embodiment of the step S150 shown in FIG. 5. FIG. 8 is a flowchart illustrating an embodiment of the step S170 shown in FIG. 5. Hereinafter, an operating method of the semiconductor memory device in accordance with an embodiment of the present disclosure will be described with reference to FIGS. 6, 7A, 7B, and 8 together.

Referring to FIG. 6, the operating method of the semiconductor memory device may be divided into a pre-program step and an erase step. The pre-program step may be performed in a period t1 to t4, and the erase step may be performed in a period t5 to t6.

In a period t1 to t2, a program pulse VPGM may be applied to first dummy word lines among the dummy word lines connected to the selected memory block. Specifically, the first dummy word lines may be the first and second drain-side dummy word lines DDWL1 and DDWL2. Accordingly, during the period t1 to t2, a threshold voltage of the drain-side dummy memory cells DDC1 and DDC2 connected to the first and second drain-side dummy word lines DDWL1 and DDWL2 may be increased. While the program pulse VPGM is applied to the first and second drain-side dummy word lines DDWL1 and DDWL2, a ground voltage VSS may be applied to the common source line CSL. Meanwhile, while the program pulse VPGM is applied to the first and second drain-side dummy word lines DDWL1 and DDWL2, the ground voltage VSS may be applied to the first and second source-side dummy word lines SDWL1 and SDWL2 and the normal word lines WL1 to WLn. Accordingly, during the period t1 to t2, a threshold voltage of the source-side dummy memory cells SDC1 and SDC2 and the normal memory cells MC1 to MCn might not be increased. The step S130 shown in FIG. 5 may correspond to an operation during the period t1 to t2 shown in FIG. 6.

Referring to FIG. 7A, the step S130 shown in FIG. 5 may include step S131 of applying the ground voltage VSS to the common source line CSL, step S133 of applying a program pass voltage to the source-side dummy word line and the normal word lines, and step S135 of applying the program pulse to the drain-side dummy word line.

Referring to the period t1 to t2 shown in FIG. 6, the ground voltage VSS is applied to the common source line CSL (S131), the ground voltage VSS is applied to the first and second source-side dummy word lines SDWL1 and SDWL2 and the normal word lines WL1 to WLn (S133), and the program pulse VPGM is applied to the first and second drain-side dummy word lines DDWL1 and DDWL2 (S135). The "program pass voltage" of the step S133 is a voltage applied to a word line, and may be a voltage which does not change the threshold voltage of memory cells. In the example shown in FIG. 6, it is illustrated that the program pass voltage is the ground voltage VSS.

In a period t3 to t4, the program pulse VPGM may be applied to second dummy word lines among the dummy word lines connected to the selected memory block. Specifically, the second dummy word lines may be the first and second source-side dummy word lines SDWL1 and SDWL2. Accordingly, during the period t3 to t4, a threshold voltage of the source-side dummy memory cells SDC1 and SDC2 connected to the first and second source-side dummy word lines SDWL1 and SDWL2 may be increased. While the program pulse VPGM is applied to the first and second source-side dummy word lines SDWL1 and SDWL2, the ground voltage VSS may be applied to the common source line CSL. Meanwhile, while the program pulse VPGM is applied to the first and second source-side dummy word lines SDWL1 and SDWL2, the ground voltage VSS may be applied to the first and second drain-side dummy word lines DDWL1 and DDWL2 and the normal word lines WL1 to WLn. Accordingly, during the period t3 to t4, a threshold voltage of the drain-side dummy memory cells DDC1 and DDC2 and the normal memory cells MC1 to MCn might not be increased. The step S150 shown in FIG. 5 may correspond to an operation during the period t3 to t4 shown in FIG. 6.

Referring to FIG. 7B, the step S150 shown in FIG. 5 may include step S151 of applying the ground voltage VSS to the common source line CSL, step S153 of applying the program pass voltage to the drain-side dummy word line and the normal word lines, and step S155 of applying the program pulse to the source-side dummy word line.

Referring to the period t3 to t4 shown in FIG. 6, the ground voltage VSS is applied to the common source line CSL (S151), the ground voltage VSS is applied to the first and second drain-side dummy word lines DDWL1 and DDWL2 and the normal word lines WL1 to WLn (S153), and the program pulse VPGM is applied to the first and second source-side dummy word lines SDWL1 and SDWL2 (S155).

In the period t5 to t6, an erase inhibit voltage Vinh may be applied to the dummy word lines DDWL1, DDWL2, SDWL1, and SDWL2, and the ground voltage VSS may be applied to the normal word lines WL1 to WLn. Also, in the period t5 to t6, the erase voltage VERS may be applied to the common source line CSL.

Referring to FIG. 8, the step S170 shown in FIG. 5 may include step S171 of applying an erase allow voltage to the normal word lines and applying the erase inhibit voltage to the dummy word lines and step S173 of applying the erase voltage to the common source line. The erase allow voltage is a voltage applied to a word line connected to memory cells selected as an erase target in an erase operation, and may be the ground voltage VSS. The erase inhibit voltage is a voltage applied to a word line connected to memory cells which does not correspond to the erase target in the erase operation, and may be a voltage higher than the erase allow voltage. In FIG. 6, it is illustrated that the erase inhibit voltage Vinh is a voltage higher than the ground voltage VSS. Meanwhile, in some embodiments, the erase inhibit voltage is applied to the dummy word lines, but the dummy word lines may be floated. Although the erase voltage VERS is applied to the common source line CSL, a voltage of the floated dummy word lines is increased, and therefore, the dummy memory cells might not be erased.

In accordance with the embodiment of the present disclosure, which has been described with respect to FIGS. 5 to 8, a pre-program operation on the dummy memory cells may be performed before the erase operation of the selected memory block. Only one program pulse is applied to the dummy memory cells without any erase verify operation, so that the pre-program operation can be performed. Accordingly, the time required to perform the pre-program operation can be reduced.

Meanwhile, in accordance with the embodiment of the present disclosure, the period t1 to t2 in which the drain-side dummy memory cells are programmed and the period t3 to t4 in which the source-side dummy memory cells are programmed may be separated from each other. The drain-side dummy memory cells and the source-side dummy memory cells are individually pre-programmed in different periods, and thus the stability of the pre-program operation can be improved.

In FIG. 6, an embodiment is illustrated, in which the program pulse VPGM is first applied to the first and second drain-side dummy word lines DDWL1 and DDWL2 and then applied to the first and second source-side dummy word lines SDWL1 and SDWL2, but the present disclosure is not limited thereto. That is, in some embodiments, the program pulse VPGS may be first applied to the first and second source-side dummy word lines SDWL1 and SDWL2, and then applied to the first and second drain-side dummy word lines DDWL1 and DDWL2.

FIG. 9 is a timing diagram illustrating an operating method of the semiconductor memory device in accordance with another embodiment of the present disclosure.

Referring to FIG. 9, the operating method of the semiconductor memory device may be divided into a pre-program step and an erase step. The pre-program step may be performed in a period t7 to t10, and the erase step may be performed in a period t11 to t12.

In a period t7 to t8, the program pulse VPGM may be applied to first dummy word lines among the dummy word lines connected to the selected memory block. Specifically, the first dummy word lines may be the first and second drain-side dummy word lines DDWL1 and DDWL2. Accordingly, during the period t7 to t8, a threshold voltage of the drain-side dummy memory cells DDC1 and DDC2 connected to the first and second drain-side dummy word lines DDWL1 and DDWL2 may be increased. While the program pulse VPGM is applied to the first and second drain-side dummy word lines DDWL1 and DDWL2, the ground voltage VSS may be applied to the common source line CSL. Meanwhile, while the program pulse VPGM is applied to the first and second drain-side dummy word lines DDWL1 and DDWL2, a program pass voltage Vpass may be applied to the first and second source-side dummy word lines SDWL1 and SDWL2 and the normal word lines WL1 to WLn. Referring to FIG. 6, while the program pulse VPGM is applied to the first and second drain-side dummy word lines DDWL1 and DDWL2, the ground voltage VSS is applied to the first and second source-side dummy word lines SDWL1 and SDWL2 and the normal word lines WL1 to WLn. However, in the embodiment shown in FIG. 9, the program pass voltage Vpass higher than the ground voltage VSS is applied to the first and second source-side dummy word lines SDWL1 and SDWL2 and the normal word lines WL1 to WLn. The program pass voltage Vpass may be a voltage lower than the program pulse VPGM.

Accordingly, during the period t7 to t8, a threshold voltage of the source-side dummy memory cells SDC1 and SDC2 and the normal memory cells MC1 to MCn might not be increased. The step S130 shown in FIG. 5 may correspond to an operation during the period t7 to t8 shown in FIG. 9.

The "program pass voltage" of the step S133 shown in FIG. 7A is a voltage applied to a word line, and may be a voltage which does not change the threshold voltage of memory cells. In the example shown in FIG. 9, it is illustrated that the program pass voltage Vpass is a voltage higher than the ground voltage VSS.

Similarly, during a period t9 to t10, the program pass voltage Vpass may be applied to the first and second drain-side dummy word lines DDWL1 and DDWL2 and the normal word lines WL1 to WLn. Accordingly, during the period t9 to t10, a threshold voltage of the drain-side dummy memory cells DDC1 and DDC2 and the normal memory cells MC1 to MCn might not be increased. The step S150 shown in FIG. 5 may correspond to an operation during the period t9 to t10 shown in FIG. 9.

In the period t11 to t12, an operation of the semiconductor memory device 100 may be identical to that of the period t5 to t6 shown in FIG. 6. Accordingly, repeated descriptions will be omitted.

Figure 11A:
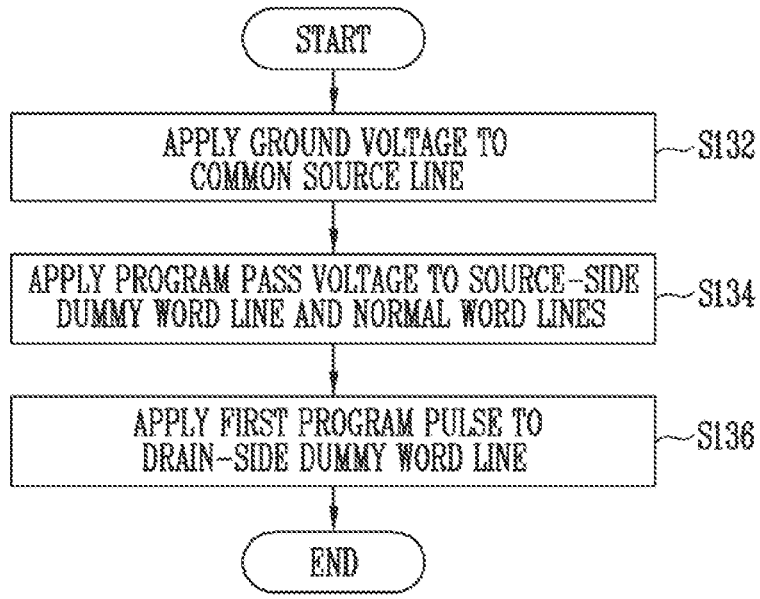
FIG. 11A is a flowchart illustrating another embodiment of the step S130 shown in FIG. 5.
Figure 11B:
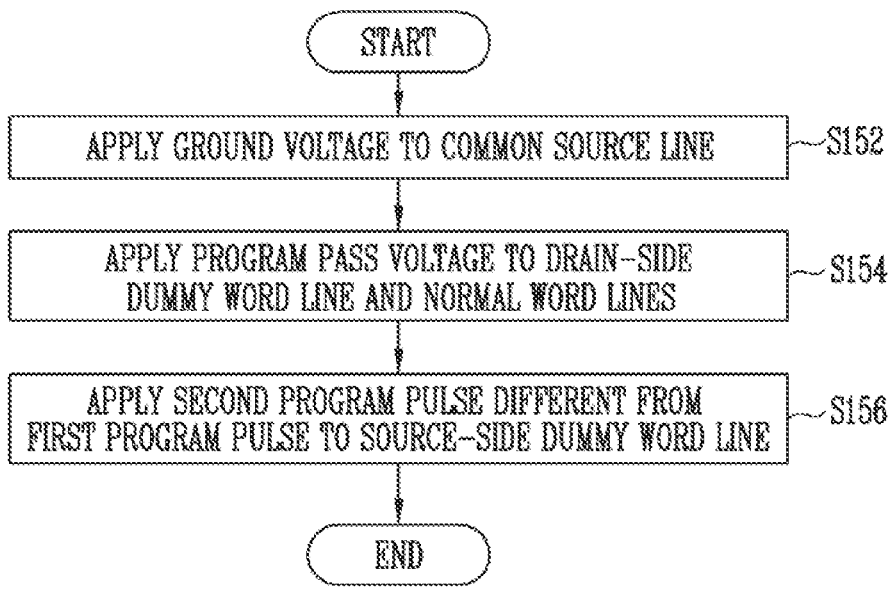
FIG. 11B is a flowchart illustrating another embodiment of the step S150 shown in FIG. 5.

FIG. 10 is a timing diagram illustrating an operating method of the semiconductor memory device in accordance with still another embodiment of the present disclosure. FIG. 11A is a flowchart illustrating another embodiment of the step S130 shown in FIG. 5. FIG. 11B is a flowchart illustrating another embodiment of the step S150 shown in FIG. 5. Hereinafter, an operating method of the semiconductor memory device in accordance with still another embodiment of the present disclosure will be described with reference to FIGS. 10, 11A, and 11B together.

Referring to FIG. 10, the operating method of the semiconductor memory device may be divided into a pre-program step and an erase step. The pre-program step may be performed in a period t13 to t16, and the erase step may be performed in a period t17 to t18.

In a period t13 to t14, a first program pulse VPGM1 may be applied to first dummy word lines among the dummy word lines connected to the selected memory block. Specifically, the first dummy word lines may be the first and second drain-side dummy word lines DDWL1 and DDWL2. Accordingly, during the period t13 to t14, a threshold voltage of the drain-side dummy memory cells DDC1 and DDC2 connected to the first and second drain-side dummy word lines DDWL1 and DDWL2 may be increased. While the first program pulse VPGM1 is applied to the first and second drain-side dummy word lines DDWL1 and DDWL2, the ground voltage VSS may be applied to the common source line CSL. Meanwhile, while the first program pulse VPGM1 is applied to the first and second drain-side dummy word lines DDWL1 and DDWL2, the program pass voltage Vpass may be applied to the first and second source-side dummy word lines SDWL1 and SDWL2 and the normal word lines WL1 to WLn. Accordingly, during the period t13 to t14, a threshold voltage of the source-side dummy memory cells SDC1 and SDC2 and the normal memory cells MC1 to MCn might not be increased. The step S130 shown in FIG. 5 may correspond to an operation during the period t13 to t14 shown in FIG. 10.

Referring to FIG. 11A, the step S130 shown in FIG. 5 may include step S132 of applying the ground voltage VSS to the common source line CSL, step S134 of applying the program pass voltage to the source-side dummy word line and the normal word lines, and step S136 of applying the first program pulse to the drain-side dummy word line.

Referring to the period t13 to t14 shown in FIG. 10, the ground voltage VSS is applied to the common source line CSL (S132), the program pass voltage Vpass is applied to the first and second source-side dummy word lines SDWL1 and SDWL2 and the normal word lines WL1 to WLn (S134), and the first program pulse VPGM1 is applied to the first and second drain-side dummy word lines DDWL1 and DDWL2 (S136).

In a period t15 to t16, a second program pulse VPGM2 may be applied to second dummy word lines among the dummy word lines connected to the selected memory block. Specifically, the second dummy word lines may be the first and second source-side dummy word lines SDWL1 and SDWL2. Accordingly, during the period t15 to t16, a threshold voltage of the source-side dummy memory cells SDC1 and SDC2 connected to the first and second source-side dummy word lines SDWL1 and SDWL2 may be increased. While the second program pulse VPGM2 is applied to the first and second source-side dummy word lines SDWL1 and SDWL2, the ground voltage VSS may be applied to the common source line CSL. Meanwhile, while the second program pulse VPGM2 is applied to the first and second source-side dummy word lines SDWL1 and SDWL2, the program pass voltage Vpass may be applied to the first and second drain-side dummy word lines DDWL1 and DDWL2 and the normal word lines WL1 to WLn. Accordingly, during the period t15 to t16, a threshold voltage of the drain-side dummy memory cells DDC1 and DDC2 and the normal memory cells MC1 to MCn might not be increased. The step S150 shown in FIG. 5 may correspond to an operation during the period t15 to t16 shown in FIG. 10.

Referring to FIG. 11B, the step S150 shown in FIG. 5 may include step S152 of applying the ground voltage VSS to the common source line CSL, step S154 of applying the program pass voltage to the drain-side dummy word line and the normal word lines, and step S156 of applying the second program pulse different from the first program pulse to the source-side dummy word line.

Referring to the period t15 to t16 shown in FIG. 10, the ground voltage VSS is applied to the common source line CSL (S152), the ground voltage VSS is applied to the first and second drain-side dummy word lines DDWL1 and DDWL2 and the normal word lines WL1 to WLn (S154), and the second program pulse VPGM2 is applied to the first and second source-side dummy word lines SDWL1 and SDWL2 (S156).

A program operation characteristic of the drain-side dummy memory cells DDC1 and DDC2 and a program operation characteristic of the source-side dummy memory cells SDC1 and SDC2 may be different from each other. Therefore, when the same program pulse is used in a pre-program operation of the drain-side dummy memory cells DDC1 and DDC2 and a pre-program operation of the source-side dummy memory cells SDC1 and SDC2, a threshold voltage distribution characteristic of the dummy memory cells DDC1, DDC2, SDC1, and SDC2 may be deteriorated. Therefore, according to the semiconductor memory device and the operating method thereof in accordance with the embodiment of the present disclosure, different program pulses may be used in the pre-program operation of the drain-side dummy memory cells DDC1 and DDC2 and the pre-program operation of the source-side dummy memory cells SDC1 and SDC2.

In the period t17 to t18, an operation of the semiconductor memory device 100 may be identical to that of the period t5 to t6 shown in FIG. 6 or that of the period t11 to t12 shown in FIG. 9. Accordingly, repeated descriptions will be omitted.

In accordance with the embodiment of the present disclosure, which has been described with reference to FIGS. 10, 11A, and 11B, a pre-program operation on dummy memory cells may be performed before the erase operation of the selected memory block. Only one program pulse is applied to the dummy memory cells without any erase verify operation, so that the pre-program operation can be performed. Accordingly, the time required to perform the pre-program operation can be reduced.

Meanwhile, in accordance with the embodiment of the present disclosure, the period t13 to t14 in which the drain-side dummy memory cells are programmed and the period t15 to t16 in which the source-side dummy memory cells are programmed may be distinguished from each other. The drain-side dummy memory cells and the source-side dummy memory cells are individually pre-programmed in different periods, and thus the stability of the pre-program can be improved.

Also, in accordance with the embodiment of the present disclosure, the first program pulse VPGM1 is used to pre-program the drain-side dummy memory cells DDC1 and DDC2, and the second program pulse VPGM2 different from the first program pulse VPGM1 is used to pre-program the source-side dummy memory cells SDC1 and SDC2.

In FIG. 10, an embodiment is illustrated, in which the first program pulse VPGM1 applied to the first and second drain-side dummy word lines DDWL1 and DDWL2 is higher than the second program pulse VPGM2 applied to the first and second source-side dummy word lines SDWL1 and SDWL2, but the present disclosure is not limited thereto. That is, in some embodiments, the first program pulse VPGM1 applied to the first and second drain-side dummy word lines DDWL1 and DDWL2 may be lower than the second program pulse VPGM2 applied to the first and second source-side dummy word lines SDWL1 and SDWL2.

FIG. 12 is a timing diagram illustrating an operating method of the semiconductor memory device in accordance with still another embodiment of the present disclosure.

Referring to FIG. 12, the operating method of the semiconductor memory device in accordance with the still another embodiment of the present disclosure may be divided into a pre-program step and an erase step. The pre-program step may be performed in a period t19 to t24, and the erase step may be performed in a period t25 to t26.

In a period t19 to t20, the first program pulse VPGM1 may be applied to the first drain-side dummy word line DDL1 among the dummy word lines connected to the selected memory block. Accordingly, during the period t19 to t20, a threshold voltage of the first drain-side dummy memory cell DDC1 connected to the first drain-side dummy word line DDWL1 may be increased. While the first program pulse VPGM1 is applied to the first drain-side dummy word line DDWL1, the ground voltage VSS may be applied to the common source line CSL. Meanwhile, while the first program pulse VPGM1 is applied to the first drain-side dummy word line DDWL1, the program pass voltage Vpass may be applied to the second drain-side dummy word line DDWL2, the first and second source-side dummy word lines SDWL1 and SDWL2, and the normal word lines WL1 to WLn. Accordingly, during the period t19 to t20, a threshold voltage of the second drain-side dummy memory cell DDC2, the source-side dummy memory cells SDC1 and SDC2, and the normal memory cells MC1 to MCn might not be increased.

In a period t20 to t21, the first program pulse VPGM1 may be applied to the second drain-side dummy word line DDWL2 among the dummy word lines connected to the selected memory block. Accordingly, during the period t20 to t21, a threshold voltage of the second drain-side dummy memory cell DDC2 connected to the second drain-side dummy word line DDWL2 may be increased. While the first program pulse VPGM1 is applied to the second drain-side dummy word line DDWL2, the ground voltage VSS may be applied to the common source line CSL. Meanwhile, while the first program pulse VPGM1 is applied to the second drain-side dummy word line DDWL2, the program pass voltage Vpass may be applied to the first drain-side dummy word line DDWL1, the first and second source-side dummy word lines SDWL1 and SDWL2, and the normal word lines WL1 to WLn. Accordingly, during the period t20 to t21, a threshold voltage of the first drain-side dummy memory cell DDC1, the source-side dummy memory cells SDC1 and SDC2, and the normal memory cells MC1 to MCn might not be increased.

In a period t22 to t23, the second program pulse VPGM2 may be applied to the first source-side dummy word line SDWL1 among the dummy word lines connected to the selected memory block. Accordingly, during the period t22 to t23, a threshold voltage of the first source-side dummy memory cell SDC1 connected to the first source-side dummy word line SDWL1 may be increased. While the second program pulse VPGM2 is applied to the first source-side dummy word line SDWL1, the ground voltage VSS may be applied to the common source line CSL. Meanwhile, while the second program pulse VPGM2 is applied to the first source-side dummy word line SDWL1, the program pass voltage Vpass may be applied to the first and second drain-side word lines DDWL1 and DDWL2, the second source-side dummy word line SDWL2, and the normal word line WL1 to WLn. Accordingly, during the period t22 to t23, a threshold voltage of the drain-side dummy memory cells DDC1 and DDC2, the second source-side dummy memory cell SDC2, and the normal memory cells MC1 to MCn might not be increased.

In a period t23 to t24, the second program pulse VPGM2 may be applied to the second source-side dummy word line SDWL2 among the dummy word lines connected to the selected memory block. Accordingly, during the period t23 to t24, a threshold voltage of the second source-side dummy memory cell SDC2 connected to the second source-side dummy word line SDWL2 may be increased. While the second program pulse VPGM2 is applied to the second source-side dummy word line SDWL2, the ground voltage VSS may be applied to the common source line CSL. Meanwhile, while the second program pulse VPGM2 is applied to the second source-side dummy word line SDWL2, the program pass voltage Vpass may be applied to the first and second drain-side dummy word lines DDWL1 and DDWL2, the first source-side dummy word line SDWL1, and the normal word lines WL1 to WLn. Accordingly, during the period t23 to t24, a threshold voltage of the drain-side dummy memory cells DDC1 and DDC2, the first source-side dummy memory cell SDC1, and the normal memory cells MC1 to MCn might not be increased.

An operation of the semiconductor memory device 100 in the period t25 to t26 may be identical to that of the period t5 to t6 shown in FIG. 6. Accordingly, repeated descriptions will be omitted.

In accordance with the embodiment shown in FIGS. 6, 9, and 10, an embodiment is illustrated, in which the first and second drain-side dummy memory cells DDC1 and DDC2 are simultaneously pre-programmed, and the first and second source-side dummy memory cells SDC1 and SDC2 are simultaneously pre-programmed. However, this is merely illustrative, and the present disclosure is not limited thereto. As shown in FIG. 12, the first and second drain-side dummy memory cells DDC1 and DDC2 may be pre-programmed during different periods, and the first and second source-side dummy memory cells SDC1 and SDC2 may be pre-programmed during different periods.

Figure 13:
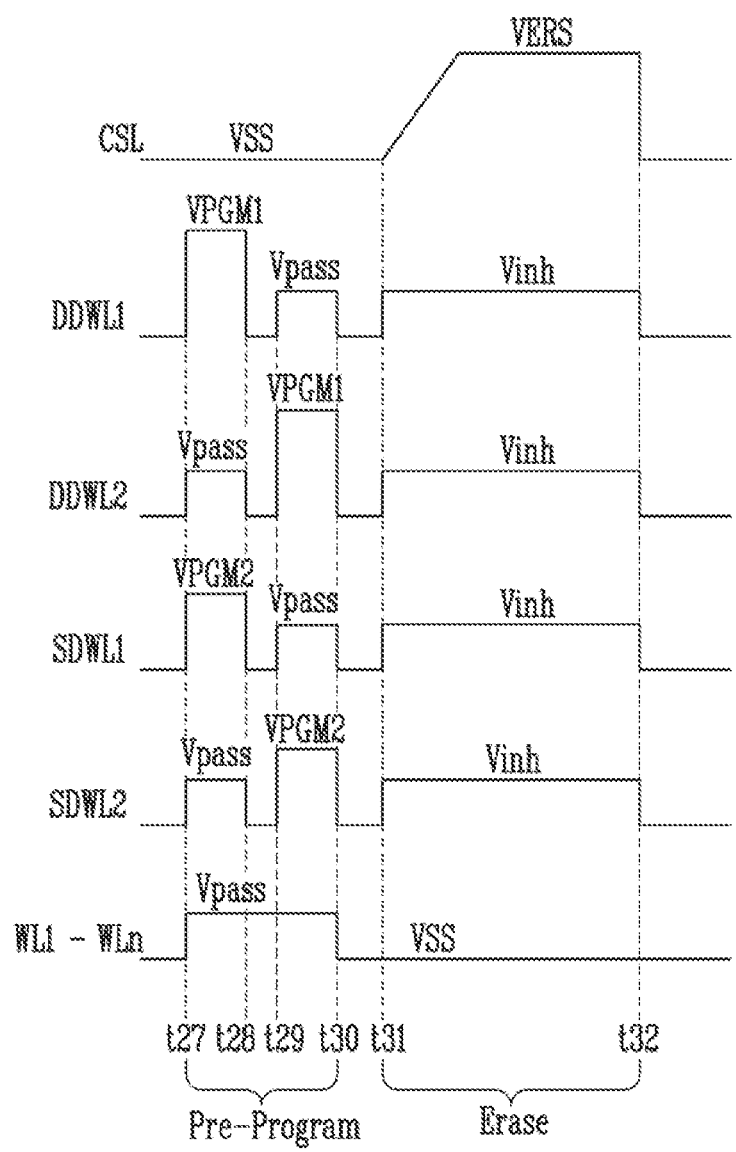
FIG. 13 is a timing diagram illustrating an operating method of the semiconductor memory device in accordance with still another embodiment of the present disclosure.
Figure 14A:
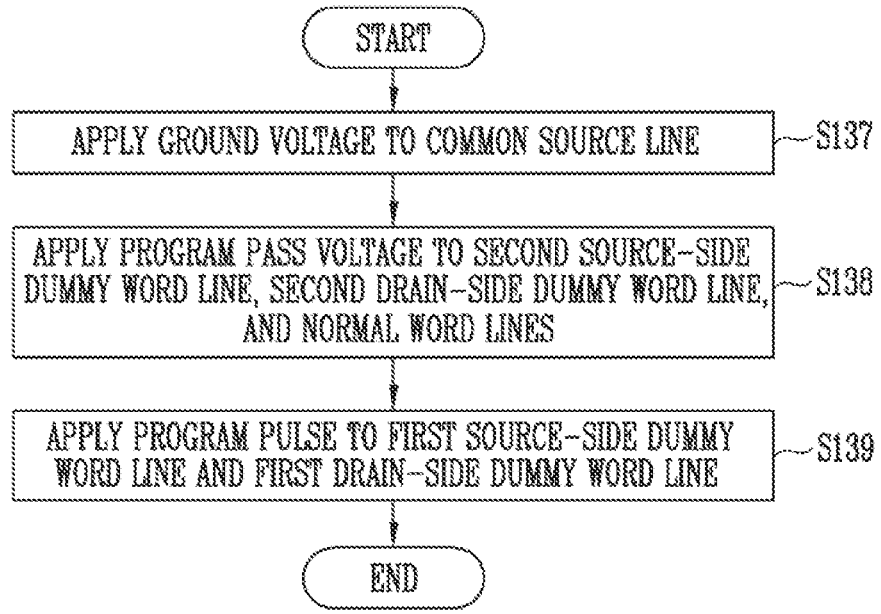
FIG. 14A is a flowchart illustrating still another embodiment of the step S130 shown in FIG. 5.
Figure 14B:
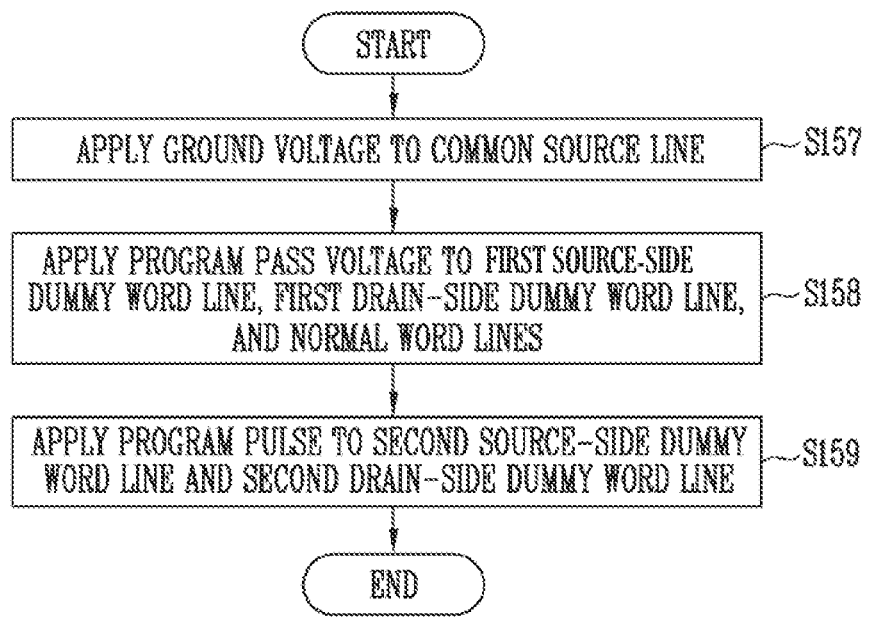
FIG. 14B is a flowchart illustrating still another embodiment of the step S150 shown in FIG. 5.

FIG. 13 is a timing diagram illustrating an operating method of the semiconductor memory device in accordance with still another embodiment of the present disclosure. FIG. 14A is a flowchart illustrating still another embodiment of the step S130 shown in FIG. 5. FIG. 14B is a flowchart illustrating still another embodiment of the step S150 shown in FIG. 5. Hereinafter, an operating method of the semiconductor memory device in accordance with still another embodiment of the present disclosure will be described with reference to FIGS. 13, 14A, and 14B together.

Referring to FIG. 13, the operating method of the semiconductor memory device may be divided into a pre-program step and an erase step. The pre-program step may be performed in a period t27 to t30, and the erase step may be performed in a period t31 to t32.

In a period t27 to t28, the program pulse may be applied to first dummy word lines among the dummy word lines connected to a selected memory block. Specifically, the first dummy word lines may be the first drain-side dummy word line DDWL1 and a first source-side dummy word line SDWL1. Accordingly, during the period t27 to t28, a threshold voltage of the first drain-side dummy memory cell DDC1 and the first source-side dummy memory cell SDC1, which are connected to the first drain-side dummy word line DDWL1 and the first source-side dummy word line SDWL1, may be increased. In an embodiment, the first program pulse VPGM1 may be applied to the first drain-side dummy word line DDWL1, and the second program pulse VPGM2 may be applied to the first source-side dummy word line SDWL1. While the program pulse is applied to the first drain-side dummy word line DDWL1 and the first source-side dummy word line SDWL1, the ground voltage VSS may be applied to the common source line CSL. Meanwhile, while the program pulse is applied to the first drain-side dummy word line DDWL1 and the first source-side dummy word line SDWL1, the program pass voltage Vpass may be applied to the second drain-side dummy word line DDWL2, the second source-side dummy word line SDWL2, and the normal word lines WL1 to WLn. Accordingly, during the period t27 to t28, a threshold voltage of the second drain-side dummy memory cell DDC2, the second source-side dummy memory cell SDC2, and the normal memory cells MC1 to MCn might not be increased. The step S130 shown in FIG. 5 may correspond to an operation during the period t27 to t28 shown in FIG. 13.

Referring to FIG. 14A, the step S130 shown in FIG. 5 may include step S137 of applying the ground voltage VSS to the common source line CSL, step S138 of applying the program pass voltage to the second source-side dummy word line, the second drain-side dummy word line, and the normal word lines, and step S139 of applying the program pulse to the first source-side dummy word line and the first drain-side dummy word line.

Referring to the period t27 to t28 shown in FIG. 13, the ground voltage VSS is applied to the common source line CSL (S137), the program pass voltage Vpass is applied to the second source-side dummy word line SDWL2, the second drain-side dummy word line DDWL2, and the normal word lines WL1 to WLn (S138), and the program pulse is applied to the first source-side dummy word line SDWL1 and the first drain-side dummy word line DDWL1 (S139). In the step S139, the first program pulse VPGM1 may be applied to the first drain-side dummy word line DDWL1, and the second program pulse VPGM2 may be applied to the first source-side dummy word line SDWL1.

In a period t29 to t30, the program pulse may be applied to second dummy word lines among the dummy word lines connected to the selected memory block. Specifically, the second dummy word lines may be the second drain-side dummy word line DDWL2 and the second source-side dummy word line SDWL2. Accordingly, during the period t29 to t30, a threshold voltage of the second drain-side dummy memory cell DDC2 and the second source-side dummy memory cell SDC2, which are connected to the second drain-side dummy word line DDWL2 and the second source-side dummy word line SDWL2, may be increased. In an embodiment, the first program pulse VPGM1 may be applied to the second drain-side dummy word line DDWL2, and the second program pulse VPGM2 may be applied to the second source-side dummy word line SDWL2. While the program pulse is applied to the second drain-side dummy word line DDWL2 and the second source-side dummy word lines SDWL2, the ground voltage VSS may be applied to the common source line CSL. Meanwhile, while the program pulse is applied to the second drain-side dummy word line DDWL2 and the second source-side dummy word ones SDWL2, the program pass voltage Vpass may be applied to the first drain-side dummy word line DDWL1, the first source-side dummy word line SDWL1, and the normal word lines WL1 to WLn. Accordingly, during the period t29 to t30, a threshold voltage of the first drain-side dummy memory cell DDC1, the first source-side dummy memory cell SDC1, and the normal memory cells MC1 to MCn might not be increased. The step S150 shown in FIG. 5 may correspond to an operation during the period t29 to t30 shown in FIG. 13.

Referring to FIG. 14B, the step S150 shown in FIG. 5 may include step S157 of applying the ground voltage VSS to the common source line CSL, step S158 of applying the program pass voltage to the first source-side dummy word line, the first drain-side dummy word line, and the normal word lines, and step S159 of applying the program pulse to the second source-side dummy word line and the second drain-side dummy word line.

Referring to the period t29 to t30 shown in FIG. 13, the ground voltage VSS is applied to the common source line CSL (S157), the program pass voltage Vpass is applied to the first source-side dummy word line SDWL1, the first drain-side dummy word line DDWL1, and the normal word lines WL1 to WLn (S158), and the program pulse is applied to the second source-side dummy word line SDWL2 and the second drain-side dummy word line DDWL2 (S159). In the step S159, the first program pulse VPGM1 may be applied to the second drain-side dummy word line DDWL2, and the second program pulse VPGM2 may be applied to the second source-side dummy word line SDWL2.

An operation of the semiconductor memory device 100 in the period t31 to t32 may be identical to that of the period t5 to t6 shown in FIG. 6 or that of the period t11 to t12 shown in FIG. 9. Accordingly, repeated descriptions will be omitted.

Figure 15:
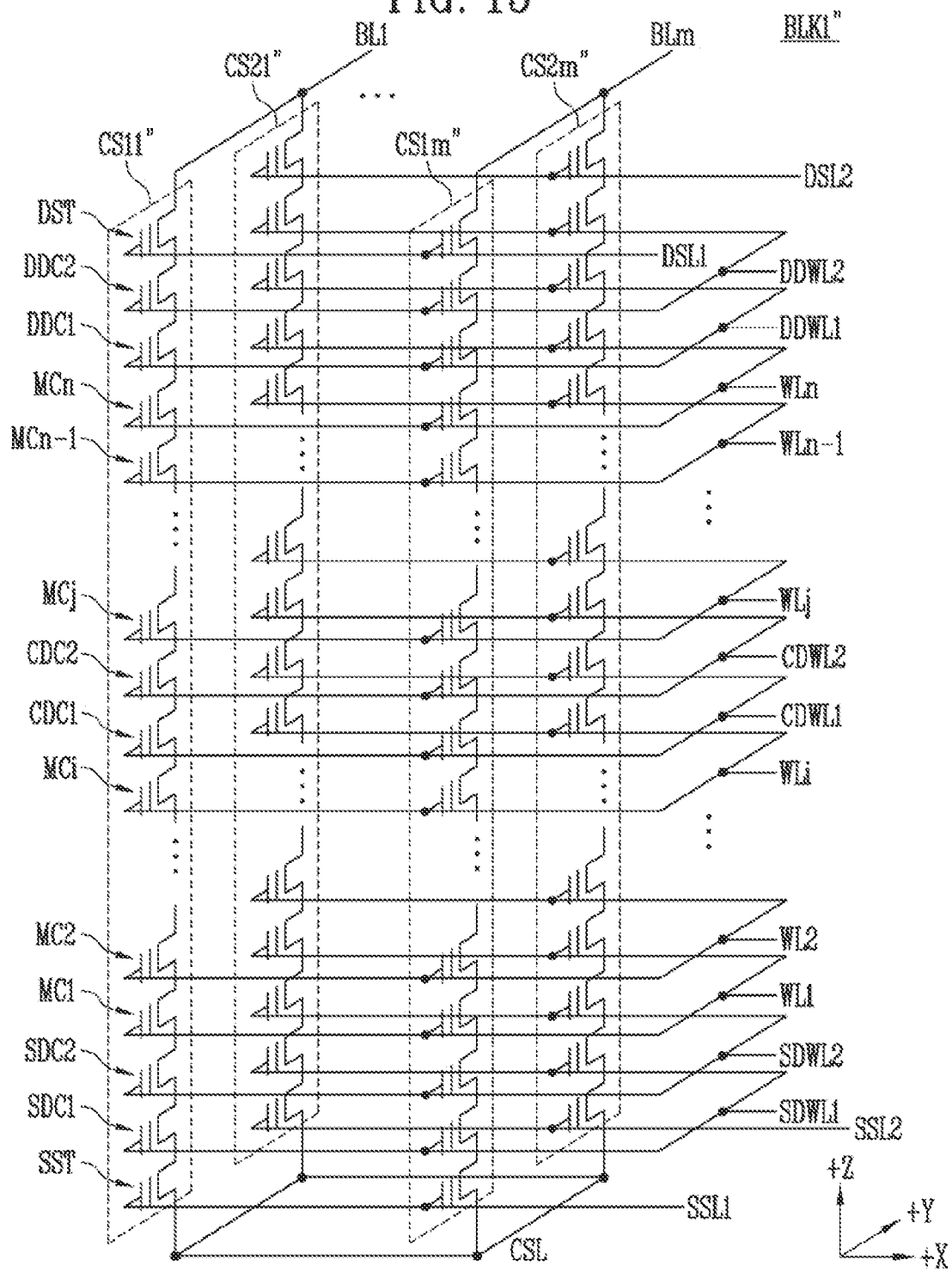
FIG. 15 is a circuit diagram illustrating still another embodiment of the one memory block among the memory blocks shown in FIG. 2.

FIG. 15 is a circuit diagram illustrating still another embodiment BLK1" of the one memory block BLK1 among the memory blocks BLK1 to BLKz shown in FIG. 2.

Referring to FIG. 15, a first memory block BLK1" includes a plurality of cell strings CS11" to CS1m" and CS21" to CS2m". Each of the plurality of cell strings CS11" to CS1m" and CS21" to CS2m" extends along the +Z direction. Each of the plurality of cell strings CS11" to CS1m" and CS21" to CS2m" includes at least one source select transistor SST, at least one source-side dummy memory cell SDC1 and SDC2, first to nth normal memory cells MC1 to MCn, at least one drain-side dummy memory cell DDC1 and DDC2, at least one central dummy memory cell CDC1 and CDC2, and at least one drain select transistor DST, which are stacked on a substrate (not shown) under the memory block BLK1".

Central dummy memory cells CDC1 and CDC2 of each cell string are connected in series between an ith normal memory cell MCi and a jth normal memory cell MCj. Central dummy memory cells at the same height are connected to the same central dummy word line. Gates of first and second central dummy memory cells CDC1 and CDC2 may be respectively connected to first and second central dummy word lines CDWL1 and CDWL2.

In an embodiment, a number of first to ith normal memory cells MC1 to MCi located between a second source-side dummy memory cell SDC2 and the first central dummy memory cell CDC1 and a number of jth to nth normal memory cells MCj to MCn located between the second central dummy memory cell CDC2 and a first drain-side dummy memory cell DDC1 may be the same.

In another embodiment, a number of first to ith normal memory cells MC1 to MCi located between the second source-side dummy memory cell SDC2 and the first central dummy memory cell CDC1 and a number of jth to nth normal memory cells MCj to MCn located between the second central dummy memory cell CDC2 and the first drain-side dummy memory cell DDC1 may be different from each other.

The memory block BLK1" shown in FIG. 15 is identical to the memory block BLK1' shown in FIG. 4, except that the memory block BLK1" further includes the central dummy memory cells CDC1 and CDC2 located between the ith normal memory cell MCi and the jth normal memory cell MCj. Therefore, repeated descriptions of the other components except the central dummy memory cells CDC1 and CDC2 will be omitted.

Figure 16:
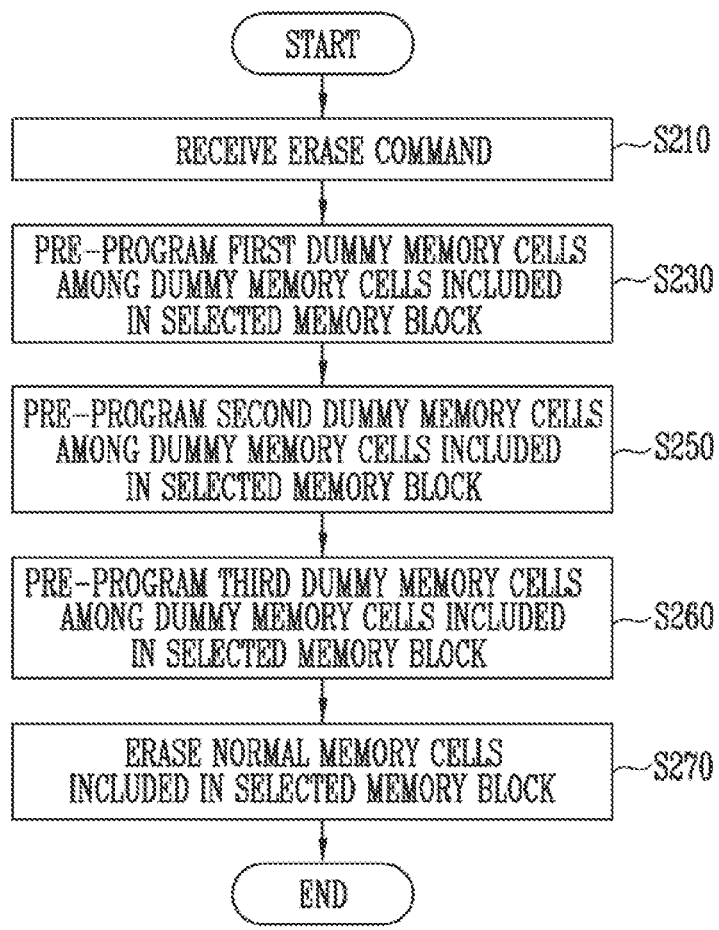
FIG. 16 is a flowchart illustrating an operating method of the semiconductor memory device in accordance with still another embodiment of the present disclosure.

FIG. 16 is a flowchart illustrating an operating method of the semiconductor memory device in accordance with still another embodiment of the present disclosure.

Referring to FIG. 16, the operating method of the semiconductor memory device in accordance with the still another embodiment of the present disclosure includes step S210 of receiving an erase command, step S230 of pre-programming first dummy memory cells among dummy memory cells included in a selected memory block, step S250 of pre-programming second dummy memory cells among the dummy memory cells included in the selected memory block, step S260 of pre-programming third dummy memory cells among the dummy memory cells included in the selected memory block, and step S270 of erasing normal memory cells included in the selected memory block.

In the step S210, the semiconductor memory device 100 may receive an erase command from the outside. More specifically, the semiconductor memory device 100 may receive the erase command from the controller. The semiconductor memory device 100 may receive an address of a memory block selected as an erase target together with the erase command.

In the step S230, first dummy memory cells among dummy memory cells included in the memory block selected as the erase target may be pre-programmed. That is, in the step S230, a pre-program operation on some dummy memory cells among a plurality of dummy memory cells included in the memory block selected as the erase target may be performed. To this end, the semiconductor memory device 100 may apply a program pulse to dummy word lines connected to the first dummy memory cells among word lines connected to the selected memory block. In an embodiment, a verify operation on the first dummy memory cells may be performed. In another embodiment, the verify operation on the first dummy memory cells might not be performed. In the step S230, the program pulse applied to the dummy word lines connected to the first dummy memory cells may have a voltage level for setting a threshold voltage of the first dummy memory cells as a target threshold voltage.

In the step S250, second dummy memory cells among the dummy memory cells included in the memory block selected as the erase target may be pre-programmed. The second dummy memory cells may be dummy memory cells different from the first dummy memory cells. To this end, the semiconductor memory device 100 may apply a program pulse to dummy word lines connected to the second dummy memory cells among the word lines connected to the selected memory block. In an embodiment, a verify operation on the second dummy memory cells may be performed. In another embodiment, the verify operation on the second dummy memory cells might not be performed. In the step S250, the program pulse applied to the dummy word lines connected to the second dummy memory cells may have a voltage level for setting a threshold voltage of the second dummy memory cells as a target threshold voltage.

In step S260, third dummy memory cells among the dummy memory cells included in the memory block selected as the erase target may be pre-programmed. The third dummy memory cells may be dummy memory cells different from the first and second dummy memory cells. To this end, the semiconductor memory device 100 may apply a program pulse to dummy word lines connected to the third dummy memory cells among the word lines connected to the selected memory block. In an embodiment, a verify operation on the third dummy memory cells may be performed. In another embodiment, the verify operation on the third dummy memory cells might not be performed. In the step S260, the program pulse applied to the dummy word lines connected to the third dummy memory cells may have a voltage level for setting a threshold voltage of the third dummy memory cells as a target threshold voltage.

In the step S270, normal memory cells included in the selected memory block may be erased. To this end, the semiconductor memory device 100 may apply an erase voltage VERS to the common source line CSL. The source select transistor SST and the drain select transistor DST may be controlled to be in the floating state. Also, the semiconductor memory device 100 may apply an erase allow voltage (e.g., a ground voltage) to normal word lines connected to the selected memory block. Also, the semiconductor memory device 100 may apply an erase inhibit voltage to the dummy word lines connected to the selected memory block. Subsequently, a potential level of a channel may be increased according to a potential level of the common source line CSL, and according to the potential level of the channel, a potential level of source select lines and drain select lines, which are connected to a plurality of source select transistors and a plurality of drain select transistors in the floating state, may be increased due to a coupling phenomenon.

Data stored in the normal memory cells are erased by the increased potential level of the channel. That is, due to an FN tunneling phenomenon, electrons stored in a charge storage layer of the normal memory cells are detrapped by the potential level of the channel. This will be described in more detail. Electrons stored in a charge storage layer of memory cells are escaped and then detrapped according to a difference between the increased potential level of the channel and a potential level of local word lines having a ground level, or hot holes generated in the channel are introduced to the charge storage layer of the memory cells, so that electrons stored in the charge storage layer are detrapped.

After the data of the normal memory cells is erased by the erase operation, the erase voltage VERS applied to the common source line CSL is blocked, and a potential of the common source line CSL is discharged. When the erase voltage VERS having a high voltage level is applied to the common source line CSL in the erase operation, the source select transistor is in the floating state. Hence, a Gate Introduced Drain Leakage (GIDL) current is generated due to a voltage difference with a source side, and hot holes are generated and then introduced in a channel direction. Therefore, a potential of the channel may be increased.

Figure 17A:
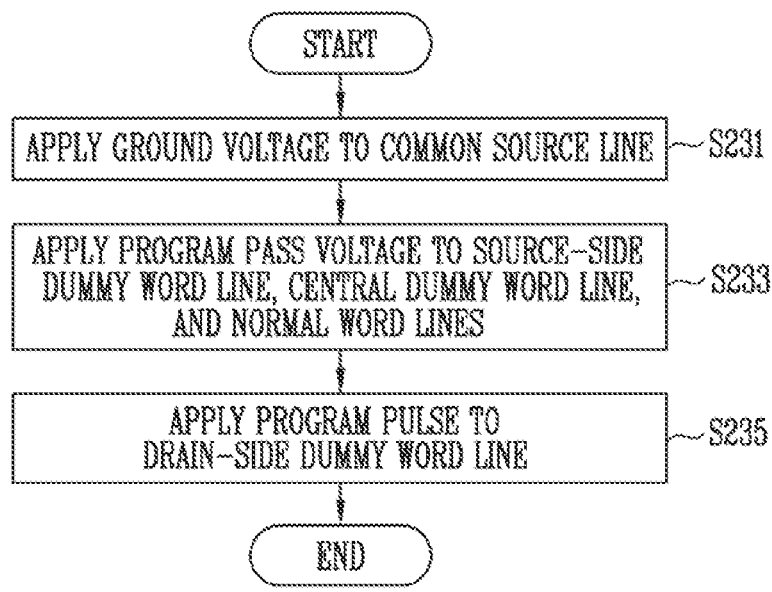
FIG. 17A is a flowchart illustrating an embodiment of step S230 shown in FIG. 16.
Figure 17B:
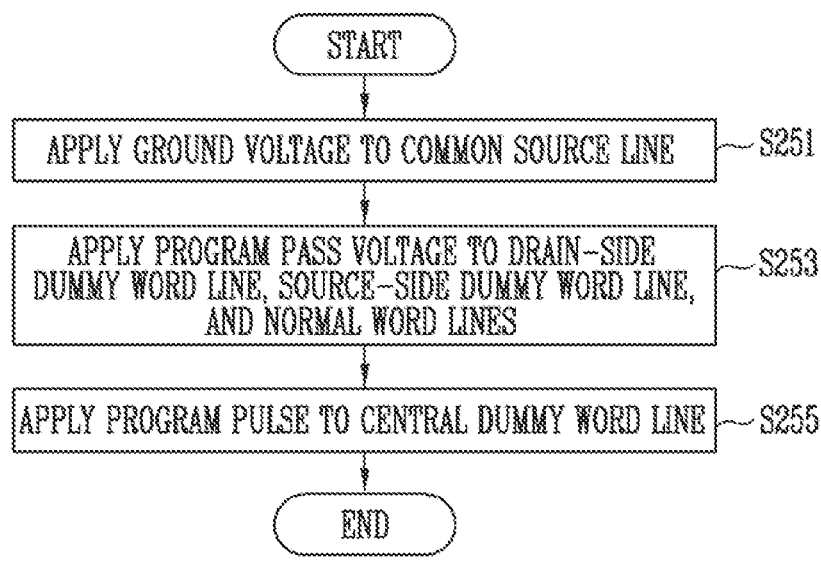
FIG. 17B is a flowchart illustrating an embodiment of step S250 shown in FIG. 16.
Figure 17C:
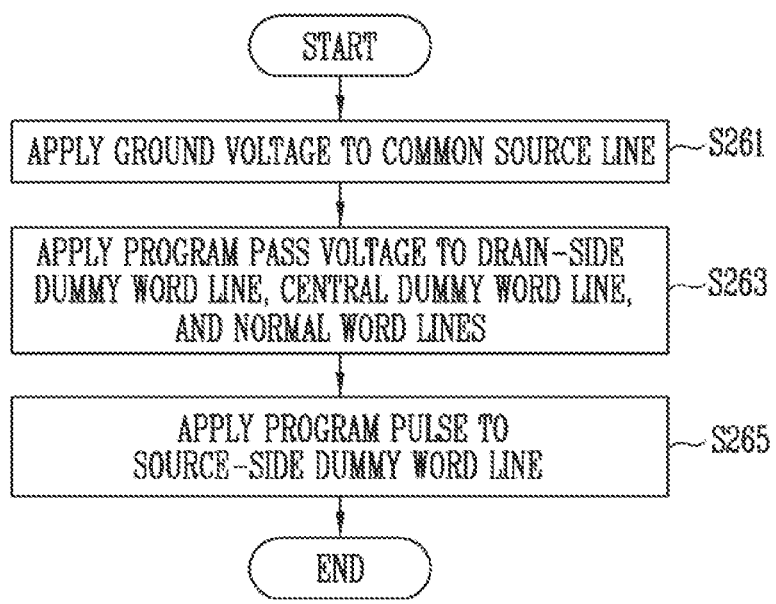
FIG. 17C is a flowchart illustrating an embodiment of step S260 shown in FIG. 16.
Figure 18:
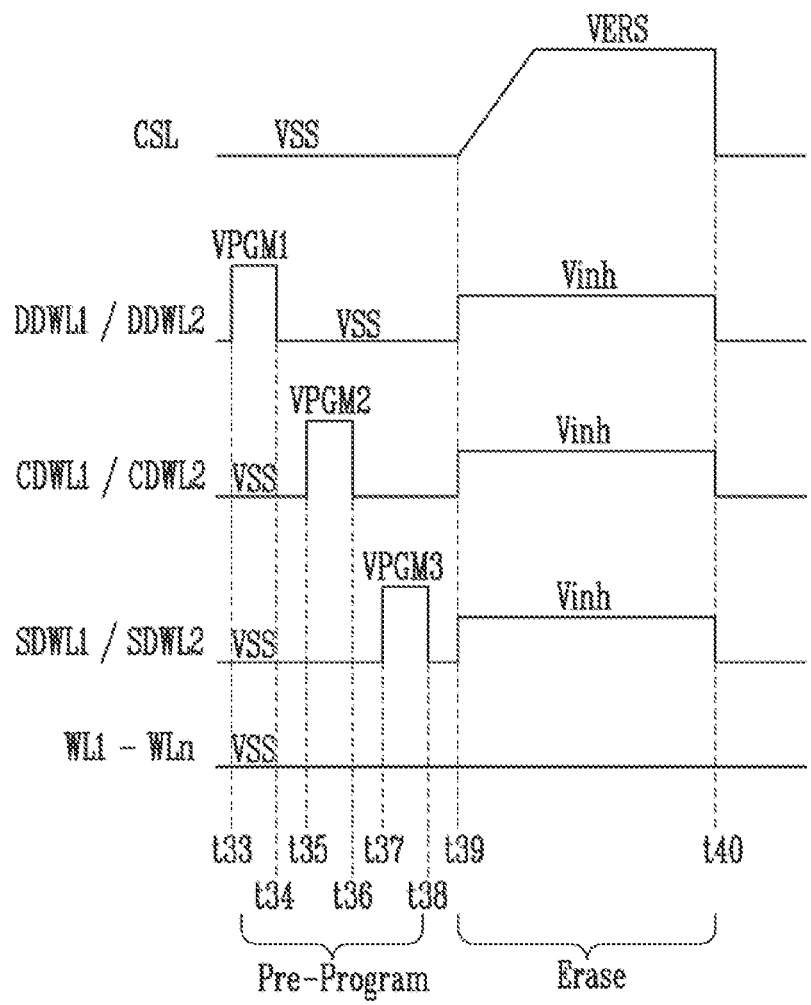
FIG. 18 is a timing diagram illustrating an operating method of the semiconductor memory device in accordance with still another embodiment of the present disclosure.

FIG. 17A is a flowchart illustrating an embodiment of the step S230 shown in FIG. 16. FIG. 17B is a flowchart illustrating an embodiment of the step S250 shown in FIG. 16. FIG. 17C is a flowchart illustrating an embodiment of the step S260 shown in FIG. 16. Meanwhile, FIG. 18 is a timing diagram illustrating an operating method of the semiconductor memory device in accordance with still another embodiment of the present disclosure. Hereinafter, an operating method of the semiconductor memory device in accordance with still another embodiment of the present disclosure will be described with reference to FIGS. 17A, 17B, and 17C together.

Referring to FIG. 18, the operating method of the semiconductor memory device may be divided into a pre-program step and an erase step. The pre-program step may be performed in a period t33 to t38, and the erase step may be performed in a period t39 to t40.

In a period t33 to t34, a first program pulse VPGM1 may be applied to first dummy word lines among the dummy word lines connected to the selected memory block. Specifically, the first dummy word lines may be the first and second drain-side dummy word lines DDWL1 and DDWL2. Accordingly, during the period t33 to t34, a threshold voltage of the drain-side dummy memory cells DDC1 and DDC2 connected to the first and second drain-side dummy word lines DDWL1 and DDWL2 may be increased. While the first program pulse VPGM1 is applied to the first and second drain-side dummy word lines DDWL1 and DDWL2, the ground voltage VSS may be applied to the common source line CSL. Meanwhile, while the first program pulse VPGM1 is applied to the first and second drain-side dummy word lines DDWL1 and DDWL2, the ground voltage VSS may be applied to the first and second source-side dummy word lines SDWL1 and SDWL2, the central dummy word lines CDWL1 and CDWL2, and the normal word lines WL1 to WLn. Accordingly, during the period t33 to t34, a threshold voltage of the source-side dummy memory cells SDC1 and SDC2, the central dummy memory cells CDC1 and CDC2, and the normal memory cells MC1 to MCn might not be increased. The step S230 shown in FIG. 16 may correspond to an operation during the period t33 to t34 shown in FIG. 18.

Referring to FIG. 17A, the step S230 shown in FIG. 16 may include step S231 of applying the ground voltage VSS to the common source line CSL, step S233 of applying the program pass voltage to the source-side dummy word line, the central dummy word line, and the normal word lines, and step S235 of applying the program pulse to the drain-side dummy word line.

Referring to the period t33 to t34 shown in FIG. 18, the ground voltage VSS is applied to the common source line (S231), the ground voltage VSS is applied to the first and second source-side dummy word lines SDWL1 and SDWL2, the first and second central dummy word lines CDWL1 and CDWL2, and the normal word lines WL1 to WLn (S233), and the first program pulse VPGM1 is applied to the first and second drain-side dummy word lines DDWL1 and DDWL2 (S235). The "program pass voltage" of the step S233 is a voltage applied to a word line, and may be a voltage which does not change the threshold voltage of memory cells. In the example shown in FIG. 18, it is illustrated that the program pass voltage is the ground voltage VSS.

In a period t35 to t36, a second program pulse VPGM2 may be applied to second dummy word lines among the dummy word lines connected to the selected memory block. In an embodiment, the second program pulse VPGM2 may have the same value as the first program pulse VPGM1. In another embodiment, the second program pulse VPGM2 may have a value different from that of the first program pulse VPGM1.

The second dummy word lines may be the first and second central dummy word lines CDWL1 and CDWL2. Accordingly, during the period t35 to t36, a threshold voltage of the central dummy memory cells CDC1 and CDC2 connected to the first and second central dummy word lines CDWL1 and CDWL2 may be increased. While the second program pulse VPGM2 is applied to the first and second central dummy word lines CDWL1 and CDWL2, the ground voltage VSS may be applied to the common source line. Meanwhile, while the second program pulse VPGM2 is applied to the first and second central dummy word lines CDWL1 and CDWL2, the ground voltage VSS may be applied to the first and second drain-side dummy word lines DDWL1 and DDWL2, the first and second source-side dummy word lines SDWL1 and SDWL2, and the normal word lines WL1 to WLn. Accordingly, during the period t35 to t36, a threshold voltage of the drain-side dummy memory cells DDC1 and DDC2, the source-side dummy memory cells SDC1 and SDC2, and the normal memory cells MC1 to MCn might not be increased. The step S250 shown in FIG. 16 may correspond to an operation during the period t35 to t36 shown in FIG. 18.

Referring to FIG. 17B, the step S250 shown in FIG. 16 may include step S251 of applying the ground voltage VSS to the common source line CSL, step S253 of applying the program pass voltage to the drain-side dummy word line, the source-side dummy word line, and the normal word lines, and step S255 of applying the program pulse to the central dummy word line.

Referring to the period t35 to t36 shown in FIG. 18, the ground voltage VSS is applied to the common source line (S251), the ground voltage VSS is applied to the first and second drain-side dummy word lines DDWL1 and DDWL2, the first and second source-side dummy word lines SDWL1 and SDWL2, and the normal word lines WL1 to WLn (S253), and the second program pulse VPGM2 to the central dummy word lines CDWL1 and CDWL2 (S255).

In a period t37 to t38, a third program pulse VPGM3 may be applied to third dummy word lines among the dummy word lines connected to the selected memory block. In an embodiment, the third program pulse VPGM3 may have the same value as at least one of the first program pulse VPGM1 and the second program pulse VPGM2. In another embodiment, the third program pulse VPGM3 may have a value different from that of at least one of the first program pulse VPGM1 and the second program pulse VPGM2.

Specifically, the third dummy word lines may be the first and second source-side dummy word lines SDWL1 and SDWL2. Accordingly, during the period t37 to t38, a threshold voltage of the source-side dummy memory cells SDC1 and SDC2 connected to the first and second source-side dummy word lines SDWL1 and SDWL2 may be increased. While the third program pulse VPGM3 is applied to the first and second source-side dummy word lines SDWL1 and SDWL2, the ground voltage VSS may be applied to the common source line CSL. Meanwhile, while the third program pulse VPGM3 is applied to the first and second source-side dummy word lines SDWL1 and SDWL2, the ground voltage VSS may be applied to the first and second drain-side dummy word lines DDWL1 and DDWL2, the first and second central dummy word lines CDWL1 and CDWL2, and the normal word lines WL1 to WLn. Accordingly, during the period t37 to t38, a threshold voltage of the drain-side dummy memory cells DDC1 and DDC2, the central dummy memory cells CDC1 and CDC2, and the normal memory cells MC1 to MCn might not be increased. The step S260 shown in FIG. 16 may correspond to an operation during the period t37 to t38 shown in FIG. 18.

Referring to FIG. 17C, the step S260 shown in FIG. 16 may include step S261 of applying the ground voltage VSS to the common source line CSL, step S263 of applying the program pass voltage to the drain-side dummy word line, the central dummy word line, and the normal word lines, and step S265 of applying the program pulse to the source-side dummy word line.

Referring to the period t37 to t38 shown in FIG. 18, the ground voltage VSS is applied to the common source line CSL (S261), the ground voltage VSS is applied to the first and second drain-side dummy word lines DDWL1 and DDWL2, the first and second central dummy word lines CDWL1 and CDWL2, and the normal word lines WL1 to WLn (S263), and the third program pulse VPGM3 is applied to the first and second source-side dummy word lines SDWL1 and SDWL2 (S265).

Meanwhile, in the period t39 to t40 shown in FIG. 18, the erase inhibit voltage Vinh may be applied to the dummy word lines DDWL1, DDWL2, CDWL1, CDWL2, SDWL1, and SDWL2, and the ground voltage VSS may be applied to the normal word lines WL1 to WLn. Also, in the period t39 to t40, the erase voltage VERS may be applied to the common source line CSL.

In accordance with the embodiment of the present disclosure, which has been described with reference to FIGS. 15 to 18, a pre-program operation on dummy memory cells of three groups may be performed before the erase operation of the selected memory block. Only one program pulse is applied to dummy memory cells with any erase verify operation, so that the pre-program operation can be performed. Accordingly, the time required to perform the pre-program operation can be reduced.

Meanwhile, in accordance with the embodiment of the present disclosure, the period t33 to t34 in which the drain-side dummy memory cells are programmed, the period t35 to 36 in which the central dummy memory cells are programmed, and the period t37 to t38 in which the source-side dummy memory cells are programmed may be distinguished from each other. The drain-side dummy memory cells, the central dummy memory cells, and the source-side dummy memory cells are individually pre-programmed in different periods, so that the stability of the pre-program operation can be improved.

In FIG. 18, an embodiment is illustrated, in which the first program pulse VPGM1 is first applied to the first and second drain-side dummy word lines DDWL1 and DDWL2, the second program pulse VPGM2 is then applied to the central dummy word lines CDWL1 and CDWL2, and finally, the third program pulse VPGM3 is applied to the first and second source-side dummy word lines SDWL1 and SDWL2, but the present disclosure is not limited thereto. That is, the sequence in which the drain-side dummy memory cells DDC1 and DDC2, the central dummy memory cells CDC1 and CDC2, and the source-side dummy memory cells SDC1 and SDC2 are programmed may be variously changed, if necessary.

Figure 19:
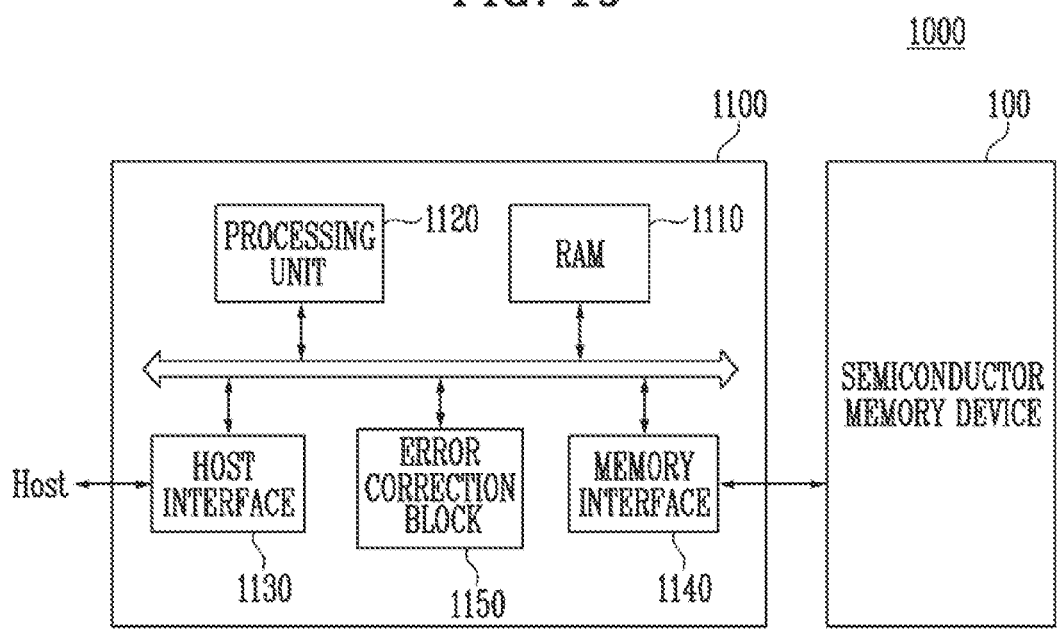
FIG. 19 is a block diagram illustrating a memory system including the semiconductor memory device shown in FIG. 1.

FIG. 19 is a block diagram illustrating a memory system 1000 including the semiconductor memory device 100 shown in FIG. 1.

Referring to FIG. 19, the memory system 1000 includes a semiconductor memory device 100 and a memory controller 1100. The semiconductor memory device 100 may be the semiconductor memory device described with reference to FIG. 1. Hereinafter, repeated descriptions will be omitted.

The memory controller 1100 is coupled to a host Host and the semiconductor memory device 100. The memory controller 1100 accesses the semiconductor memory device 100 in response to a request from the host Host. For example, the memory controller 1100 controls read, write, erase, and background operations of the semiconductor memory device 100. The memory controller 1100 provides an interface between the semiconductor memory device 100 and the host Host. The memory controller 1100 drives firmware for controlling the semiconductor memory device 100.

The memory controller 1100 includes random access memory (RAM) 1110, a processing unit 1120, a host interface 1130, a memory interface 1140, and an error correction block 1150. The RAM 1110 is used as at least one of working memory of the processing unit 1120, cache memory between the semiconductor memory device 100 and the host Host, and buffer memory between the semiconductor memory device 100 and the host Host. The processing unit 1120 controls overall operations of the memory controller 1100. In addition, the memory controller 1100 may temporarily store program data provided from the host Host in a write operation.

The host interface 1130 includes a protocol for exchanging data between the host Host and the memory controller 1100. In an embodiment, the memory controller 1100 communicates with the host Host through at least one of various interface protocols such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, an Integrated Drive Electronics (IDE) protocol, and a private protocol.

The memory interface 1140 interfaces with the semiconductor memory device 100. For example, the memory interface 1140 may include a NAND interface or a NOR interface.

The error correction block 1150 detects and corrects an error of data received from the semiconductor memory device 100 by using an error correction code (ECC). In an embodiment, the error correction block 1150 may be provided as a component of the memory controller 1100.

The memory controller 1100 and the semiconductor memory device 100 may be integrated into one semiconductor device. In an embodiment, the memory controller 1100 and the semiconductor memory device 100 may be integrated into one semiconductor device, to constitute a memory card. For example, the memory controller 1100 and the semiconductor memory device 100 may be integrated into one semiconductor device, to constitute a memory card such as a PC card (Personal Computer Memory Card International Association (PCMCIA)), a Compact Hash (CF) card, a Smart Media Card (SM or SMC), a memory stick, a Multi-Media Card (MMC, RS-MMC or MMCmicro), an SD Card (SD, miniSD, microSD or SDHC), or a Universal Hash Storage (UFS).

The memory controller 1100 and the semiconductor memory device 100 may be integrated into one semiconductor device to constitute a semiconductor drive (solid state drive (SSD)). The semiconductor drive SSD includes a storage device configured to store data in a semiconductor memory. If the memory system 1000 is used as the semiconductor drive SSD, the operating speed of the host Host coupled to the memory system 1000 can be remarkably improved.

As another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the semiconductor memory device 100 or the memory system 1000 may be packaged in various forms. For example, the semiconductor memory device 100 or the memory system 1000 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP).

Figure 20:
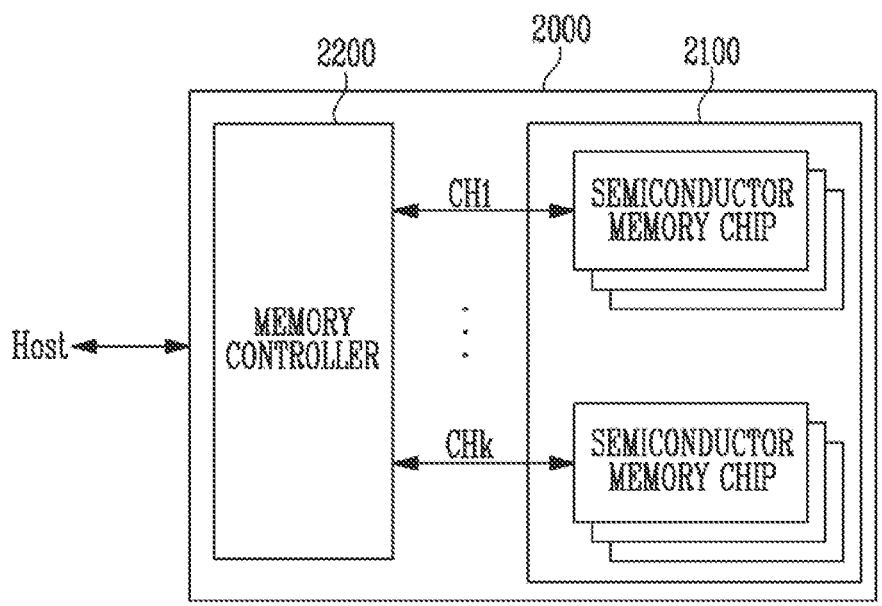
FIG. 20 is a block diagram illustrating an application example of the memory system shown in FIG. 19.

FIG. 20 is a block diagram illustrating an application example of the memory system shown 1000 in FIG. 19.

Referring to FIG. 20, a memory system 2000 includes a semiconductor memory device 2100 and a memory controller 2200. The semiconductor memory device 2100 includes a plurality of semiconductor memory chips. The plurality of semiconductor memory chips are divided into a plurality of groups.

In FIG. 20, it is illustrated that the plurality of groups communicate with the memory controller 2200 respectively through first to kth channels CH1 to CHk. Each semiconductor memory chip may be configured and operated identically to the semiconductor memory device 100 described with reference to FIG. 1.

Each group communicates with the memory controller 2200 through one common channel. The memory controller 2200 is configured identically to the memory controller 1100 described with reference to FIG. 19. The memory controller 2200 controls the plurality of memory chips of the semiconductor memory device 2100 through the plurality of channels CH1 to CHk.

Figure 21:
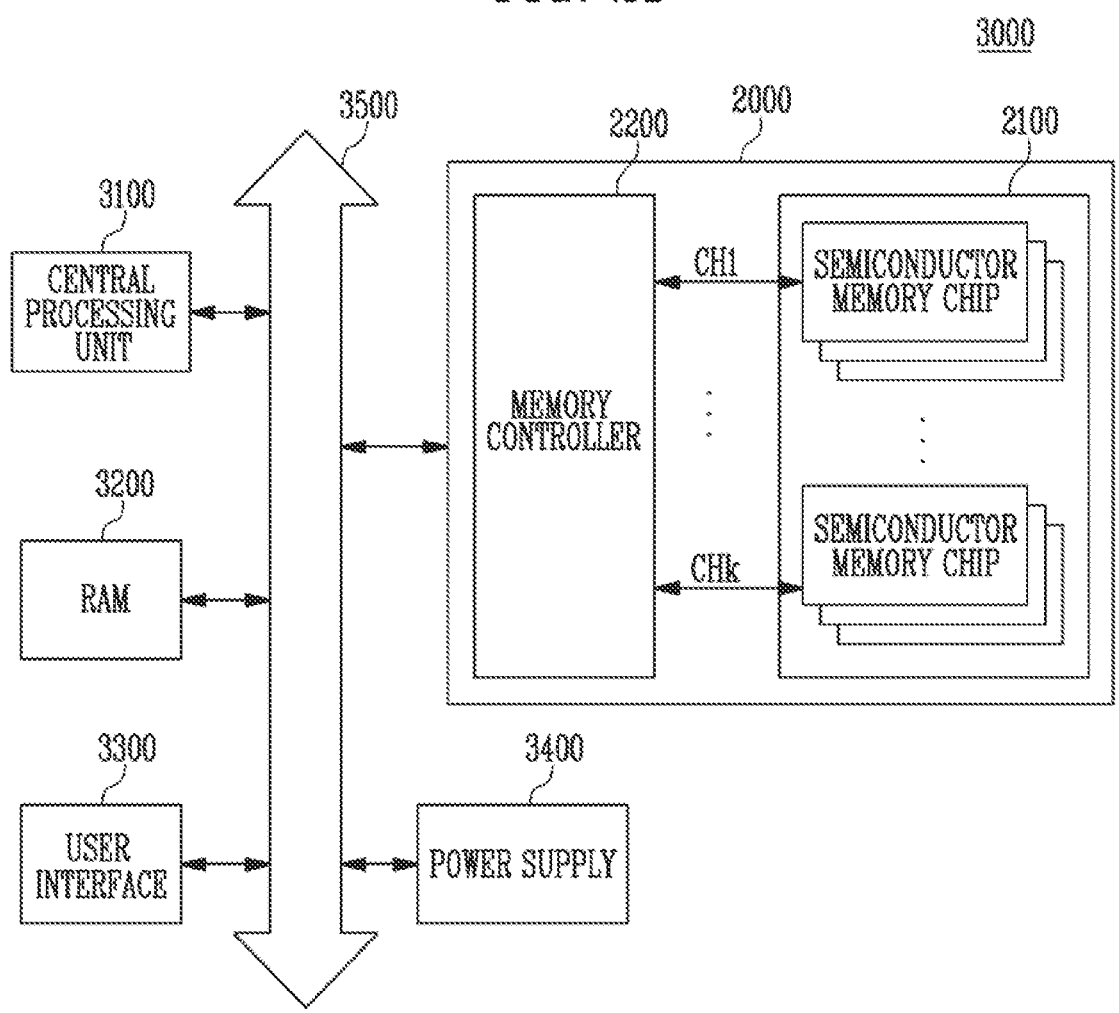
FIG. 21 is a block diagram illustrating a computing system including the memory system described with reference to FIG. 20.

FIG. 21 is a block diagram illustrating a computing system 3000 including the memory system 2000 described with reference to FIG. 20.

Referring to FIG. 21, the computing system 3000 includes a central processing unit 3100, RAM 3200, a user interface 3300, a power supply 3400, a system bus 3500, and the memory system 2000.

The memory system 2000 is electrically coupled to the central processing unit 3100, the RAM 3200, the user interface 3300, and the power supply 3400 through the system bus 3500. Data supplied through user interface 3300 or data processed by the central processing unit 3100 are stored in the memory system 2000.

In FIG. 21, there is illustrated a case where the semiconductor memory device 2100 is coupled to the system bus 3500 through the memory controller 2200. However, the semiconductor memory device 2100 may be directly coupled to the system bus 3500. The function of the memory controller 2200 may be performed by the central processing unit 3100 and the RAM 3200.

In FIG. 21, there is illustrated a case where the memory system 2000 described with reference to FIG. 20 is provided. However, the memory system 2000 may be replaced by the memory system 1000 described with reference to FIG. 19. In an embodiment, the computing system 3000 may include both of the memory systems 1000 and 2000 described with reference to FIGS. 19 and 20.

In accordance with an embodiment of the present disclosure, a semiconductor memory device and an operating method of the semiconductor memory device provides improved reliability.

While the present disclosure has been shown and described with reference to certain embodiments, it will be understood by those skilled in the art that various changes in form and detail may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been illustrated in the drawings and described in the specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A semiconductor memory device comprising:
   a memory block including dummy memory cells, connected to dummy word lines, and normal memory cells, connected to normal word lines;
   a peripheral circuit configured to perform an erase operation on the memory block; and
   control logic configured to control an operation of the peripheral circuit, wherein the control logic is configured to control the peripheral circuit to perform:
      a pre-program operation on first dummy memory cells connected to a plurality of first dummy word lines among the dummy word lines, by a single pulse program using a first program pulse, in response to an erase command for the memory block, wherein the first dummy memory cells are simultaneously pre-programmed;
      a pre-program operation on second dummy memory cells connected to second dummy word lines among the dummy word lines, by the single pulse program using a second program pulse, after the pre-program operation on the first dummy memory cells; and
      an erase operation on the normal memory cells,
   wherein the control logic determines a level of the first program pulse based on a target threshold voltage of the first dummy memory cells and a level of the second program pulse based on a target threshold voltage of the second dummy memory cells.

2. The semiconductor memory device of claim 1, wherein the memory block includes:
   drain select transistors connected to bit lines; and
   source select transistors connected to a common source line,
   wherein the first dummy memory cells are located between the normal memory cells and the drain select transistors, and wherein the second dummy memory cells are located between the normal memory cells and the source select transistors.

3. The semiconductor memory device of claim 2, wherein, during the pre-program operation on the first dummy memory cells, the control logic controls the peripheral circuit to:
apply a ground voltage to the common source line;
apply a program pass voltage to the second dummy word lines and the normal word lines; and
apply the first program pulse to the plurality of first dummy word lines.

4. The semiconductor memory device of claim 3, wherein, during the pre-program operation on the second dummy memory cells, the control logic controls the peripheral circuit to:
apply a ground voltage to the common source line;
apply a program pass voltage to the plurality of first dummy word lines and the normal word lines; and
apply the second program pulse to the second dummy word lines.

5. The semiconductor memory device of claim 4, wherein the first program pulse has the same voltage magnitude as that of the second program pulse.

6. The semiconductor memory device of claim 4, wherein the first program pulse has a higher voltage than that of the second program pulse.

7. The semiconductor memory device of claim 4, wherein the first program pulse has a lower voltage than that of the second program pulse.

8. The semiconductor memory device of claim 1, wherein, during the erase operation on the normal memory cells, the control logic controls the peripheral circuit to:
apply an erase inhibit voltage to the plurality of first dummy word lines and the second dummy word lines;
apply an erase allow voltage to the normal word lines; and
apply an erase voltage to a common source line.

9. The semiconductor memory device of claim 1, wherein, during the erase operation on the normal memory cells, the control logic controls the peripheral circuit to:
float the plurality of first dummy word lines and the second dummy word lines;
apply an erase allow voltage to the normal word lines; and
apply an erase voltage to a common source line.

10. The semiconductor memory device of claim 1, wherein the control logic controls the peripheral circuit to perform a pre-program operation on third dummy memory cells connected to third dummy word lines among the dummy word lines, after the pre-program operation on the second dummy memory cells is performed.

11. The semiconductor memory device of claim 10, wherein the memory block includes:
drain select transistors connected to bit lines; and
source select transistors connected to a common source line,
wherein the first dummy memory cells are located between the normal memory cells and the drain select transistors,
wherein the second dummy memory cells are located between the normal memory cells, and
wherein the third memory cells are located between the normal memory cells and the source select transistors.

12. A method for operating a semiconductor memory device including a plurality of memory blocks each including first dummy memory cells, connected to a plurality of first dummy word lines, second dummy memory cells, connected to a second dummy word line, and normal memory cells, connected to normal word lines, the method comprising:
receiving an erase command;
determining a level of a first program pulse based on a target threshold voltage of the first dummy memory cells;
pre-programming first dummy memory cells included in a selected memory block, of the plurality of memory blocks, corresponding to the erase command among the plurality of memory blocks by a single pulse program using the first program pulse, wherein the first dummy memory cells included in the selected memory block are simultaneously pre-programmed;
determining a level of a second program pulse based on a target threshold voltage of the second dummy memory cells;
pre-programming second dummy memory cells included in the selected memory block by the single pulse program using the second program pulse after pre-programming the first dummy memory cells in the selected memory block; and
erasing normal memory cells included in the selected memory block.

13. The method of claim 12, wherein the pre-programming of the first dummy memory cells included in the selected memory block includes:
applying a ground voltage to a common source line connected to the selected memory block;
applying a program pass voltage to the second dummy word line and the normal word lines connected to the selected memory block; and
applying the first program pulse to the plurality of first dummy word lines connected to the selected memory block.

14. The method of claim 13, wherein the pre-programming of the second dummy memory cells included in the selected memory block includes:
applying a ground voltage to the common source line connected to the selected memory block;
applying a program pass voltage to the plurality of first dummy word lines and the normal word lines connected to the selected memory block; and
applying the second program pulse to the second dummy word line connected to the selected memory block.

15. The method of claim 14, wherein:
the first dummy memory cells are drain-side dummy memory cells; and
the second dummy memory cells are source-side dummy memory cells.

16. The method of claim 14, wherein:
the first dummy memory cells are source-side dummy memory cells; and
the second dummy memory cells are drain-side dummy memory cells.

17. The method of claim 12, wherein the erasing of the normal memory cells included in the selected memory block includes:
applying an erase allow voltage to the normal word lines connected to the selected memory block and applying an erase inhibit voltage to the plurality of first dummy word lines and the second dummy word line connected to the selected memory block; and
applying an erase voltage to a common source line.

18. The method of claim 12, wherein the erasing of the normal memory cells included in the selected memory block includes:

applying an erase allow voltage to the normal word lines connected to the selected memory block and floating the plurality of first dummy word lines and the second dummy word line connected to the selected memory block; and applying an erase voltage to a common source line.

19. The method of claim 12, wherein the selected memory block further includes third dummy memory cells connected to a third dummy word line, and wherein the method further comprises pre-programming the third dummy memory cells, after pre-programming the second dummy memory cells included in the selected memory block and before erasing the normal memory cells included in the selected memory block.

20. The method of claim 19, wherein:

the first dummy memory cells are drain-side dummy memory cells;

the second dummy memory cells are dummy memory cells located between the normal memory cells; and the third dummy memory cells are source-side dummy memory cells.

* * * * *